United States Patent
Dozen et al.

(10) Patent No.: US 7,939,385 B2
(45) Date of Patent: May 10, 2011

(54) METHOD FOR MANUFACTURING THIN FILM INTEGRATED CIRCUIT, AND ELEMENT SUBSTRATE

(75) Inventors: Yoshitaka Dozen, Isehara (JP); Tomoko Tamura, Atsugi (JP); Takuya Tsurume, Atsugi (JP); Koji Dairiki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 290 days.

(21) Appl. No.: 12/255,117

(22) Filed: Oct. 21, 2008

(65) Prior Publication Data

US 2009/0050964 A1  Feb. 26, 2009

Related U.S. Application Data

(62) Division of application No. 11/151,230, filed on Jun. 14, 2005, now Pat. No. 7,452,786.

(30) Foreign Application Priority Data

Jun. 29, 2004  (JP) .................................. 2004-192250

(51) Int. Cl.
*H01L 21/00* (2006.01)
*H01L 21/46* (2006.01)

(52) U.S. Cl. ........ 438/149; 438/455; 438/458; 438/459; 438/464; 257/696; 257/777; 257/E21.413; 257/E23.064; 257/E27.111

(58) Field of Classification Search .................. 438/149, 438/455, 458, 459, 464; 257/696, 777, E21.413, 257/E23.064, E27.111

See application file for complete search history.

(56) References Cited

U.S. PATENT DOCUMENTS

| 6,887,650 | B2 | 5/2005 | Shimoda et al. | |
| 7,060,153 | B2 | 6/2006 | Yamazaki et al. | |
| 7,091,070 | B2* | 8/2006 | Imai et al. | 438/149 |
| 7,122,445 | B2 | 10/2006 | Takayama et al. | |
| 7,271,076 | B2 | 9/2007 | Yamazaki et al. | |
| 7,732,262 | B2* | 6/2010 | Imai et al. | 438/149 |

(Continued)

FOREIGN PATENT DOCUMENTS

EP    1 193 759    4/2002

(Continued)

OTHER PUBLICATIONS

International Search Report dated Mar. 15, 2005 for PCT/JP2004/018978 filed Dec. 14, 2004.

(Continued)

*Primary Examiner* — Dao H Nguyen
(74) *Attorney, Agent, or Firm* — Eric J. Robinson; Robinson Intellectual Property Law Office, P.C.

(57) ABSTRACT

Application form of and demand for an IC chip formed with a silicon wafer are expected to increase, and further reduction in cost is required. An object of the invention is to provide a structure of an IC chip and a process capable of producing at a lower cost. A feature of the invention is to use a metal film and a reactant having the metal film as a separation layer. An etching rate of the metal film or the reactant having metal is high, and a physical means in addition to a chemical means of etching the metal film or the reactant having metal can be used in the invention. Thus, the IDF chip can be manufactured more simply and easily in a short time.

50 Claims, 30 Drawing Sheets

U.S. PATENT DOCUMENTS

2001/0015256 A1* 8/2001 Yamazaki et al. ............ 156/289
2001/0053559 A1 12/2001 Nagao et al.
2003/0032210 A1 2/2003 Takayama et al.

FOREIGN PATENT DOCUMENTS

| | | |
|---|---|---|
| JP | 2001-260580 | 9/2001 |
| JP | 2001-272923 | 10/2001 |
| JP | 2003-203898 | 7/2003 |
| WO | WO 03/010825 | 2/2003 |
| WO | WO 2005/057658 | 6/2005 |

OTHER PUBLICATIONS

Written Opinion dated Mar. 15, 2005 for PCT/JP2004/018978 filed Dec. 14, 2004.
International Search Report dated Mar. 22, 2005 for PCT/JP2005/001541 filed Jan. 27, 2005.
Written Opinion dated Mar. 22, 2005 for PCT/JP2005/001541 filed Jan. 27, 2005.
"Sense of Crisis" is a trigger. Ignited Evolution of a Sesame-Grain Sized Chip, Leading Trends, Nikkei Electronics, Nov. 18, 2002, p. 67-76.

* cited by examiner a                                      b c                                      d e f g h

METHOD FOR MANUFACTURING THIN FILM INTEGRATED CIRCUIT, AND ELEMENT SUBSTRATE

BACKGROUND OF THE INVENTION

1. Field of the Invention

The present invention relates to a method for manufacturing a thin film integrated circuit which can store much information and an element substrate in which the thin film integrated circuit is manufactured.

2. Description of the Related Art

In recent years, there has been an increasing need for a card with an IC chip or a tag with an IC chip capable of contactless data communication in all fields that require automatic identification, such as securities and management of goods. In consideration of application, it is required to manufacture such an IC card or an IC tag at a low cost since most IC cards or IC tags are to be thrown away after use. Cost reduction is required particularly for an IC chip formed with a silicon wafer.

As an application of such an IC chip, an IC chip is put on a part of an animal and is used to control infectious diseases and to assure quality for safety management of livestock. Similarly, vegetables are sold with IC chips which store information on the producer, production area, use of pesticides, and the like for safety management of vegetables.

As another application, it is proposed that an IC chip is mounted on securities to prevent abuse thereof and to allow the securities to be reused when they are returned to the regular manager (Reference 1: Japanese Patent Laid-Open No. 2001-260580).

Reduction in cost of such an IC chip formed with a silicon wafer is close to the limit. However, the diversity of application of an IC chip and the demand for an IC chip are expected to increase, and further cost reduction is required.

Handling of an extremely thin IC chip is complicated in a manufacturing process.

SUMMARY OF THE INVENTION

It is an object of the invention to provide a structure and a simple and easy process which enable production at a much lower cost.

In view of the above object, a thin film integrated circuit (also referred to as an IDF (ID Flexible) chip) is formed over a substrate having an insulating surface (insulating substrate), separated from the insulating substrate, and further transposed to another insulating substrate (also referred to as a transposition substrate). One feature of the invention is that IDF chips are prevented from being separated from each other in the separation step.

An extremely thin IDF chip can be manufactured by separating an insulating substrate. After separated from the insulating substrate, the IDF chip may be transferred to a transposition substrate. The transposition substrate at this time is preferably a substrate having flexibility (hereinafter also referred to as a flexible substrate). In some cases, transferring an element of an IDF chip (including one in process of manufacturing) to another substrate as described above is referred to as "transfer". The flexible substrate is often inexpensive, and reduction in cost of the IDF chip can be achieved. In addition, the insulating substrate can be reused. Therefore, further reduction in cost of the IDF chip can be achieved.

Specifically, according to the invention, the insulating substrate is separated by removing a metal film formed over the insulating substrate and oxide, nitride, or nitride oxide (hereinafter also collectively referred to as a reactant) having the metal over the metal film. As the metal, an element selected from W, Ti, Ta, Mo, Nd, Ni, Co, Zr, Zn, Ru, Rh, Pd, Os, and Ir or an alloy material or a compound material containing the element as its main component can be used. As the oxide, nitride, or nitride oxide, in the case of using W, Mo, or a mixture of W and Mo for the metal film, oxide, nitride, or nitride oxide of W, Mo, or the mixture thereof is used. As for the metal film, a single layer structure of the metal or a film having a reactant or a laminated structure thereof can be used.

A method for removing the metal film includes a chemical removal method with the use of an etchant (including gas or liquid) and a physical removal method with stress applied. The chemical removal method and the physical removal method may be combined with each other. Since the metal film having a single layer structure or a laminated structure is removed by the etchant, such a layer can be referred to as a separation layer. It is preferable to chemically remove the separation layer using an etchant, since generation of a residue or the like can be suppressed.

Note that the chemical method and the physical method may be combined with each other in the invention to remove the separation layer.

In order to remove the separation layer, a groove is provided in a layer formed over the separation layer so as to reach the separation layer, in other word, to expose the separation layer. Then, the separation layer can be removed by introducing an etchant into the groove.

A gas or liquid including halide can be used as the etchant. Typically, a gas or liquid including halogen fluoride can be used, and for example, $ClF_3$ (chlorine trifluoride) can be used as halogen fluoride.

When an antenna is separately formed and then attached to an IDF chip, a substrate to be provided with an antenna (referred to as an antenna substrate) is attached. Thereafter, the separation layer may be removed. In this case, an antenna substrate is provided with an opening and is attached to an insulating substrate that is provided with an IDF chip and a groove; thereafter, a separation layer is removed by introducing an etchant into the opening and the groove. IDF chips are fixed since it is held by the antenna substrate. Accordingly, antennas can be attached to integrated IDF chips without being separated from each other.

As another means to prevent IDF chips from being separated from each other, there is a method that a part of an insulating film or a conductive film formed between the IDF chips is left unremoved while forming a groove (the unremoved region is referred to as a connection region). In this case, the separation layer is removed by an etchant introduced from the groove. However, the IDF chips are integrated without being separated from each other since the IDF chips are connected to each other by the connection region. Subsequently, an antenna can be formed if necessary.

One feature of an element substrate in which an IDF chip is manufactured as described above is to have an insulating substrate provided with a plurality of thin film integrated circuits with a separation layer therebetween, an antenna substrate placed opposite to the insulating substrate, wherein the antenna substrate is provided with an antenna and an opening, and a groove is provided between the thin film integrated circuits to correspond to the opening.

One feature of an element substrate having another structure is to have an insulating substrate provided with a plurality of thin film integrated circuits with a separation layer therebetween, an antenna substrate placed opposite to the insulating substrate, wherein the plurality of thin film integrated circuits are integrated by a connection region, the antenna substrate is provided with an antenna and an opening, a groove is provided between the thin film integrated circuits to correspond to the opening, and an opening is provided in the thin film integrated circuit.

The separation layer preferably has a laminated structure of a metal film and oxide, nitride, or nitride oxide having the metal over the metal film. In the case of using W, Mo, or a mixture of W and Mo as metal for the metal film, an example of the separation layer is a laminated structure of W, Mo, or a mixture of W and Mo and oxide, nitride, or nitride oxide thereof.

Since an etching rate of the metal film or the reactant having metal is high, the IDF chip can be manufactured in a short time in the invention. Further, a physical means in addition to a chemical means of etching the metal film or the reactant having metal can be used in the invention. Thus, the IDF chip can be manufactured more simply and easily and in a short time. The insulating substrate can be removed and an IDF chip can be transposed to an inexpensive flexible substrate, and the insulating substrate can be reused. Therefore, the IDF chip can be manufactured at a low cost.

According to the invention, IDF chips can be manufactured without being separated from each other. Consequently, there is no concern that an exhaust system of an apparatus is clogged with IDF chips during manufacturing. The complexity of handling extremely small IDF chips can be reduced. A thin IDF chip formed over a large substrate might warp due to stress. However, the warpage can be prevented since IDF chips can be manufactured to be connected with each other. A method which provides a connection region between the IDF chips can enhance warpage prevention effect. As described above, the invention can provide a simple and easy method for manufacturing an IDF chip.

DETAILED DESCRIPTION OF THE INVENTION

Figure 1A:
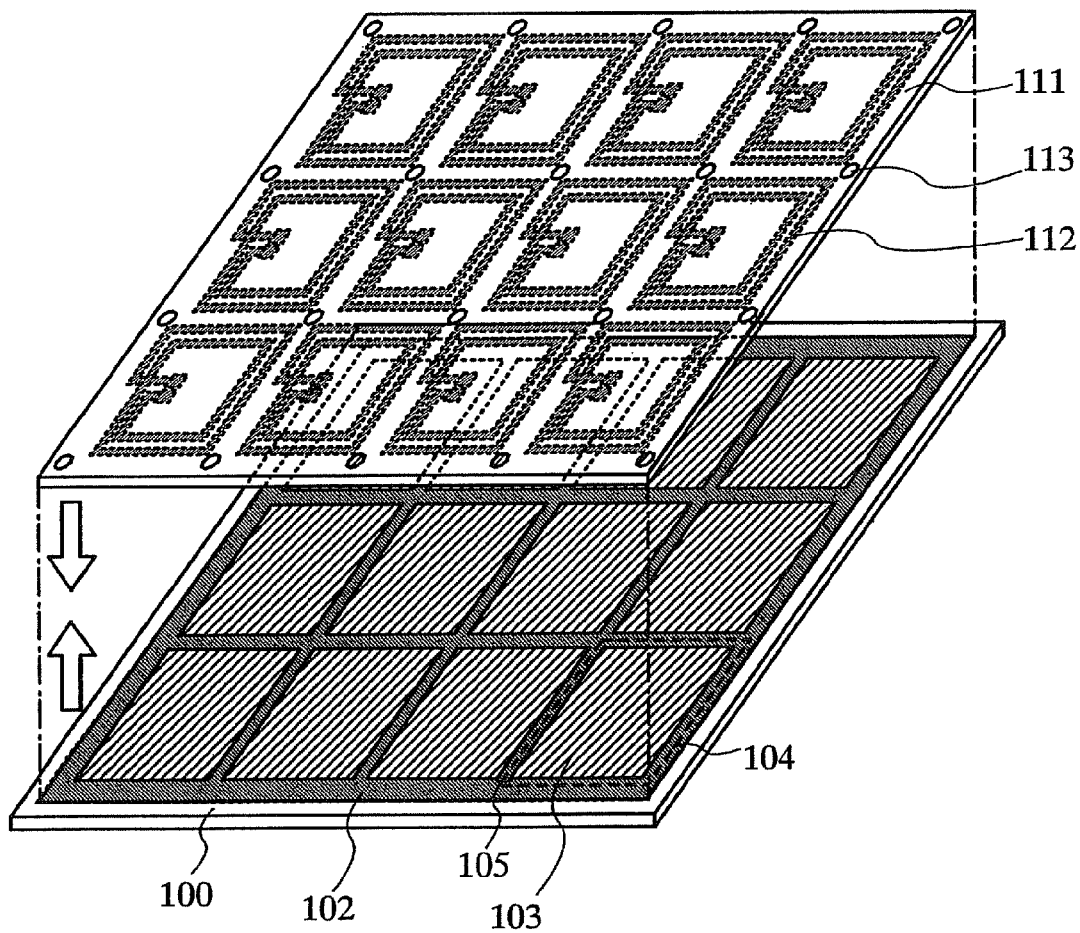
FIGS. 1A and 1B show a step of manufacturing a thin film integrated circuit.

Preferred embodiments of the present invention are hereinafter described with reference to attached drawings. The present invention is not limited to the following description. As is easily known to a person skilled in the art, the mode and the detail of the invention can be variously changed without departing from the purpose and the scope of the present invention. Thus, the present invention is not interpreted while limiting to the following description of the embodiment mode. Note that the same reference numeral is given to the same portion or a portion having a similar function among diagrams for showing the embodiment mode, and repetitive description is omitted.

Embodiment Mode 1

A mode of removing a metal film that is a separation layer and a reactant having the metal, after attaching an antenna substrate, is described in this embodiment mode.

As shown in FIG. 1A, a metal film 102, and a thin film transistor (also referred to as a TFT) layer 103 having a semiconductor film as an active region are sequentially formed over an insulating substrate 100. Further, a reactant having the metal is formed over the metal film 102. A plurality of IDF chips 104 can be formed with the thin film transistor. Although a detailed structure of the TFT layer is to be described below, the semiconductor film is formed to be 0.2 µm or less, typically, 40 nm to 170 nm, and preferably, 50 nm to 150 nm in thickness.

Because of having an extremely thin semiconductor film as an active region, the IDF chip can be made thinner than a chip formed with a silicon wafer. A specific thickness of the IDF chip is 0.3 µm to 3 µm, typically, approximately 2 µm.

Then, a groove 105 is formed on the TFT layer 103 at the boundary between the IDF chips. The groove 105 can be formed by dicing, scribing, etching with the use of a mask, or the like. The groove 105 is formed to have such a depth as to expose a separation layer. Since the reactant is formed over the separation layer, the groove 105 is formed to expose the reactant. Note that the groove 105 need not necessarily be formed at every boundary between the IDF chips, but it may be formed at intervals of boundaries between the IDF chips.

Figure 21A:
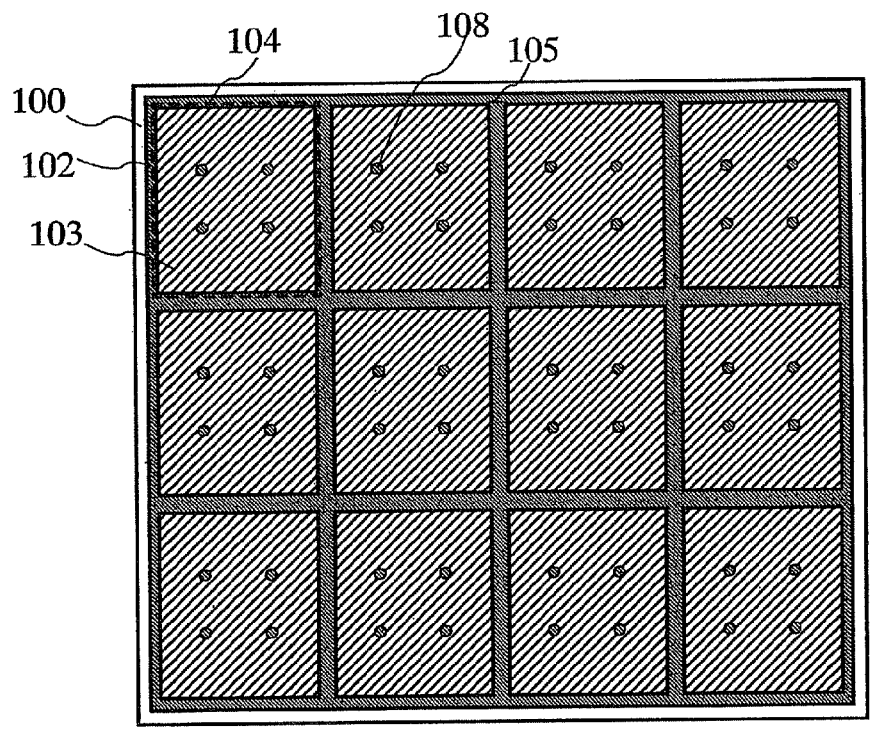
FIGS. 21A and 21B show a step of manufacturing a thin film integrated circuit.

As shown in FIG. 21A, an opening 108 may be formed in the TFT layer 103 in the IDF chip. The opening 108 needs to be formed in the TFT layer 103 except in a region where the semiconductor film included in the thin film transistor is formed. When the opening 108 is utilized in combination with the groove 105, the time needed to remove the separation layer can be shortened. Accordingly, the size of the groove 105 can be reduced.

A substrate made of glass such as barium borosilicate glass or aluminoborosilicate glass; a quartz substrate; or the like can be used as the insulating substrate 100. In addition, a substrate made of a synthetic resin such as plastic typified by polyethyleneterephthalate (PET), polyethylenenaphthalate (PEN), or polyethersulfone (PES) or acrylic can be used as another substrate having an insulating surface. A metal such as stainless steel, a semiconductor substrate, or the like provided on the surface thereof with an insulating film of silicon oxide, silicon nitride, or the like can also be used. In the case of using such an insulating substrate, there is less limitation on the shape of a mother substrate, compared with the case of taking a chip out of a circular silicon wafer. Therefore, reduction in cost of an IDF chip can be achieved.

As the metal film 102, a single layer of an element selected from W, Ti, Ta, Mo, Nd, Ni, Co, Zr, Zn, Ru, Rh, Pd, Os, and Ir or an alloy material or a compound material containing the element as its main component or a laminated layer thereof can be used. In the case of using $ClF_3$ for an etching gas, it is preferable to use W or Mo as the metal since an etching rate thereof is high. In particular, tungsten oxide which is oxide of W is preferable since it has a high rate of reaction with $ClF_3$ and the separation layer can be removed in a short time.

The metal film can be formed by a sputtering method, a plasma CVD method, or the like. In the case of using a sputtering method as a specific manufacturing method, the metal film can be formed over the insulating substrate 100 using metal as a target. Note that the metal film is formed to have a thickness of 10 nm to 200 nm, preferably, 50 nm to 75 nm. A nitrided metal film, in other words, a nitride metal film may be formed as the metal film. In addition, nitrogen or oxygen may be added to the metal film. Nitrogen or oxygen can be added to the metal film by, for example, ion-implanting nitrogen or oxygen in the metal film, forming a metal film by a sputtering method with a film formation chamber in a nitrogen or oxygen atmosphere, or using nitride metal as a target. In the case of using a mixture of the metal for the metal film, a plurality of targets such as first metal and second metal is set, or a target of an alloy of first metal and second metal is set in a film formation chamber to form the metal film by a sputtering method. In the case of forming, for example, a mixture of W and Mo ($W_{(x)}Mo_{(1-x)}$), a target of W and a target of Mo may be used, or a target of an alloy of W and Mo may be used.

A base film is formed over the insulating substrate 100 so that the TFT layer is not etched. The base film can be formed using an insulating film containing oxygen or nitrogen such as a silicon oxide ($SiO_x$) film, silicon nitride ($SiN_x$) film, a silicon oxynitride ($SiO_xN_y$) (x>y) film, or a silicon nitride oxide ($SiN_xO_y$) (x>y) (x, y=1, 2 . . . ) film. The base film can have a single layer structure or a laminated structure thereof.

When the base film is formed, oxide, nitride, or nitride oxide (corresponding to a reactant having metal) is formed over the surface of the metal film. Oxide, nitride, or nitride oxide is preferably used for the separation layer. This is because oxide, nitride, or nitride oxide has a high rate of reaction with an etching gas, particularly, $ClF_3$ and can be separated simply and easily in a short time. Note that separation can be performed when at least oxide, nitride, or. nitride oxide is removed by an etching gas. In the invention, the separation layer preferably has a laminated structure of a metal film and a reactant having the metal.

When oxide, nitride, or nitride oxide is formed over the surface of the metal film, change in a chemical state is caused in some cases. In the case of forming, for example, an oxide film having W, change in a valence of tungsten oxide ($WO_x$ (x=2 to 3)) is caused. Accordingly, oxide, nitride, or nitride oxide can be put into a state where it can be easily separated by a physical means. Removal can be performed simply and easily in a short time by combining a physical means with a chemical means.

As a method for forming oxide which is a reactant, a thin oxide film can be formed by treating with an aqueous solution including sulfuric acid, hydrochloric acid, or nitric acid, an aqueous solution of a mixture of sulfuric acid, hydrochloric acid, or nitric acid and a hydrogen peroxide solution, or ozone water. As another method, a thin oxide film may be formed by plasma treatment in an oxygen atmosphere, oxidation treatment with ozone generated by ultraviolet ray irradiation in an oxygen containing atmosphere, or heating at 200° C. to 350° C. using a clean oven.

An etching rate can be controlled by selecting a metal film and a reactant included in the separation layer as described above. In particular, tungsten oxide which is oxide of W is preferable since it has a high rate of reaction with $ClF_3$ and the separation layer can be removed in a short time.

An antenna substrate 111 is provided with a plurality of antennas 112 having a predetermined shape and is suitably provided with an opening 113. The opening has a circular shape (corresponding to a so-called hole), a rectangular shape (corresponding to a so-called slit), or the like. In addition, the opening is formed to overlap the groove 105.

The insulating substrate 100 is attached to the antenna substrate 111 with an adhesive or the like. An anisotropic conductor, an ultrasonic adhesive, or an ultraviolet curing resin in which a conductor is dispersed can be used as the adhesive.

Figure 1B:
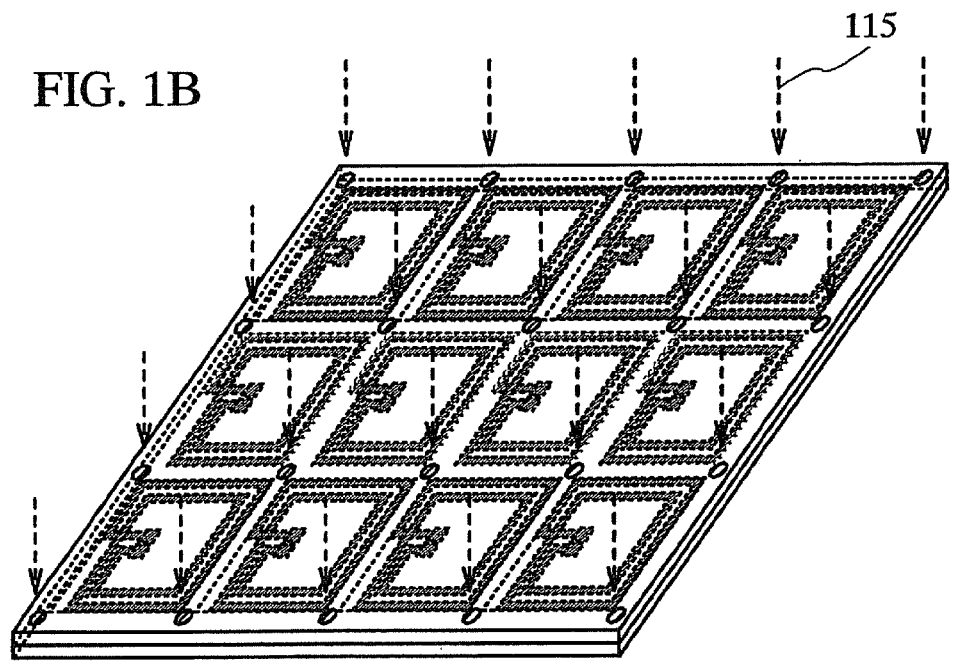

As shown in FIG. 1B, an etchant 115 is introduced into the opening and the groove with the antenna substrate attached to the insulating substrate to remove the separation layer. A gas or liquid including halogen fluoride can be used as the etchant.

The insulating substrate is separated after the separation layer is removed. Then, each IDF chip is cut by a dicing, scribing, or laser cutting method. Each IDF chip can be cut by using a laser which is absorbed by a glass substrate, such as a $CO_2$ laser. The thus cut IDF chip can have an area of 5 mm squared (25 $mm^2$) or less, preferably, 0.3 mm squared (0.09 $mm^2$) to 4 mm squared (16 $mm^2$).

After cutting each IDF chip, the periphery of the IDF chip such as a side face may be covered with an organic resin such as an epoxy resin. Accordingly, the IDF chip is protected from outside and becomes easily portable.

The IDF chip of the invention can be completed without an insulating surface and be mounted on many articles. Therefore, the IDF chip can be reduced in thickness and weight. The IDF chip of the invention is not noticeable in the article mounted therewith and does not cause disfigurement.

The IDF chip that is separately transferred to a transposition substrate may be mounted. The transposition substrate is preferably a flexible substrate. A substrate made from a synthetic resin such as plastic typified by polyethyleneterephthalate (PET), polyethylenenaphthalate (PEN), or polyetersulfone (PES) or acrylic can be used as the flexible substrate.

A thermosetting resin, an ultraviolet curing resin, an epoxy resin, a resin additive, two-sided tape, or the like can be used as an adhesive for attaching the flexible substrate. A conductor is preferably dispersed in a resin material among the above-described adhesive so as to conduct electricity to the IDF chip.

As a result of transferring the IDF chip to the flexible substrate, the breaking strength of the IDF chip can be increased comparing to the state not having the flexible substrate. The IDF chip transferred to the flexible substrate can be made lightweight, thin, and flexible comparing to the IDF chip formed over the insulating substrate.

The separated insulating substrate 100 can be reused. Accordingly, reduction in cost of the IDF chip can be achieved. In the case of reuse, dicing, scribing, or the like in forming the groove is preferably controlled, not to damage the insulating substrate 100. However, even when the insulating substrate is damaged, planarizing treatment can be performed by forming an organic resin or an inorganic film by an application method, a droplet discharge method, or the like. Note that a droplet discharge method is a method for selectively discharging (spraying) a droplet (also referred to as a dot) of a composition mixed with a material of a conductive film, an insulating film, or the like, which is also referred to as an ink-jet method depending on its mode.

The IDF chip has a semiconductor film of 0.2 μm or less as an active region and is very thin, unlike a chip formed with a silicon wafer. In order to increase the strength of such a thin IDF chip, the method for transferring to a flexible substrate as described above can be employed. Such a thin, lightweight, or highly flexible IDF chip is harder to damage than a chip formed with a silicon wafer.

The IDF chip is in no danger of wave absorption and has good reception of signals compared to a chip formed with a silicon wafer. Since the IDF chip does not have a silicon wafer, it can transmit light.

Note that the case of attaching the IDF chip to the antenna is described in this embodiment mode; however, the antenna may be directly formed over the IDF chip. In that case, the separation of the IDF chips can be prevented by using an insulating substrate where an antenna is not formed in place of the antenna substrate. Thus, the effect of the invention can be obtained.

In addition, the IDF chip is not limited to the form with an antenna mounted. Specifically, the IDF chip includes a contactless IDF chip mounted with an antenna (also referred to as an RFID tag), a contact IDF chip provided with a terminal to be connected to an external power source without an antenna mounted, and a hybrid IDF chip which is a combination of a contactless type and a contact type.

The contactless IDF chip is described in this embodiment mode, but it may also be either a contact IDF chip or a hybrid IDF chip. This is because, even in the case of a contact IDF chip without an antenna, the separation of the IDF chips can be prevented by using not the antenna substrate but an insulating substrate where an antenna is not formed and the effect of the invention can be obtained.

When an IDF chip is formed using an insulating substrate in this manner, there is less limitation on the shape of a mother substrate compared with the case of taking a chip out of a circular silicon wafer. Therefore, the productivity of an IDF chip can be improved and mass production thereof can be performed. For example, the number of chips in the case of using a silicon wafer with a diameter of 12 inches is compared with that in the case of using a glass substrate with a size of 730×920 mm². The area of the former, the silicon wafer, is about 73000 mm², whereas the area of the latter, the glass substrate, is about 672000 mm². The glass substrate is about 9.2 times as large as the silicon substrate. The glass substrate with an area of approximately 672000 mm² can be provided with, leaving the cutting margin out of consideration, approximately 672000 IDF chips of 1 mm squared, which is about 9.2 times as many as the silicon substrate. Since mass production of the IDF chip using the glass substrate with a size of 730×920 mm² can be achieved with fewer steps than the case of using the silicon substrate with a diameter of 12 inches, the amount of capital investment can be reduced to one-third. Accordingly, the cost of an IDF chip can be reduced. An IDF chip whose unit price is very low can generate huge profits by reducing unit cost.

In addition, the insulating substrate can be reused; thus, cost can be reduced. Therefore, the invention can realize lower cost than a conventional IC chip which is thinned by polishing a silicon wafer.

Embodiment Mode 2

A mode of selectively forming a groove and partially leaving an insulating film, a conductive film, or the like provided between IDF chips is described in this embodiment mode.

Figure 8A:
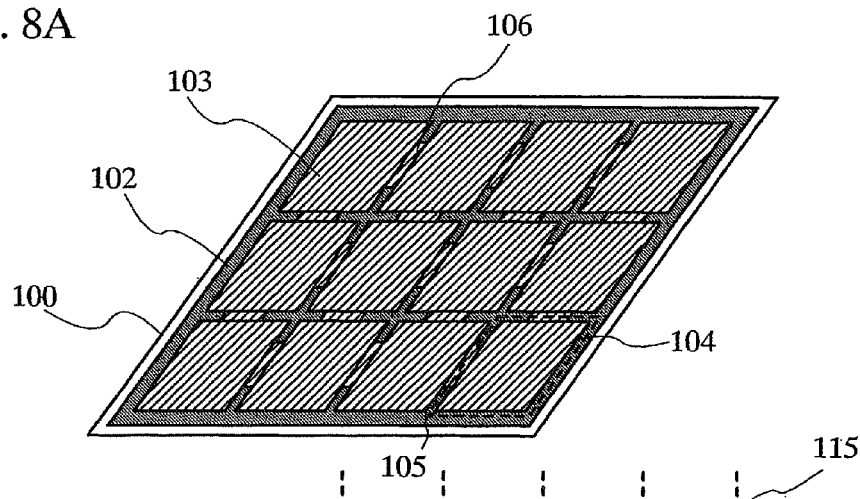
FIGS. 8A to 8C show a step of manufacturing a thin film integrated circuit.

As shown in FIG. 8A, a metal film 102 as a separation layer, and a TFT layer 103 are sequentially formed over an insulating substrate 100, thereby forming a plurality of IDF chips 104 similarly as in Embodiment Mode 1. Further, as the separation layer, a reactant having the metal is formed over the metal film 102. Note that details of the TFT layer are to be described below.

Since a groove 105 formed at the boundary between the IDF chips is selectively formed, an insulating film, a conductive film, or the like is left at the boundary between the IDF chips. Such an insulating film, a conductive film, or the like at the boundary between the IDF chips is referred to as a connection region 106. Note that the connection region 106 may have a function of connecting the IDF chips to be connected and may have either a single layer structure of only an insulating film or a conductive film or a laminated structure.

Figure 21B:
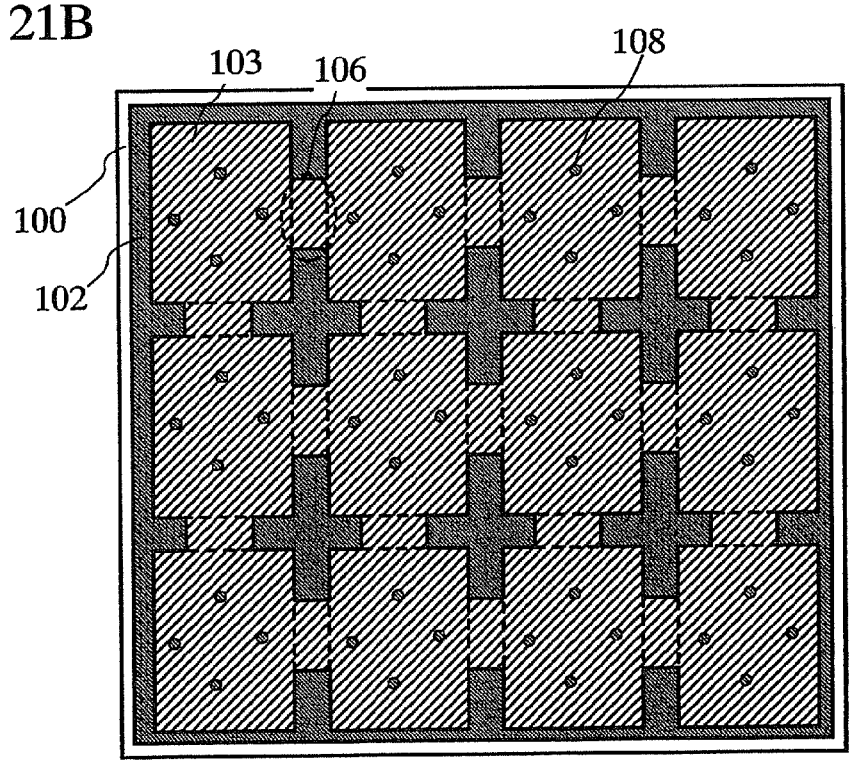

As shown in FIG. 21B, an opening 108 may be formed in the TFT layer 103 in the IDF chip. The opening needs to be formed in the TFT layer 103 except in a region where the semiconductor film included in the thin film transistor is formed. When the opening 108 is utilized in combination with the groove 105, the time needed to remove the separation layer can be shortened. Accordingly, the size of the groove 105 can be reduced.

Figure 8B:
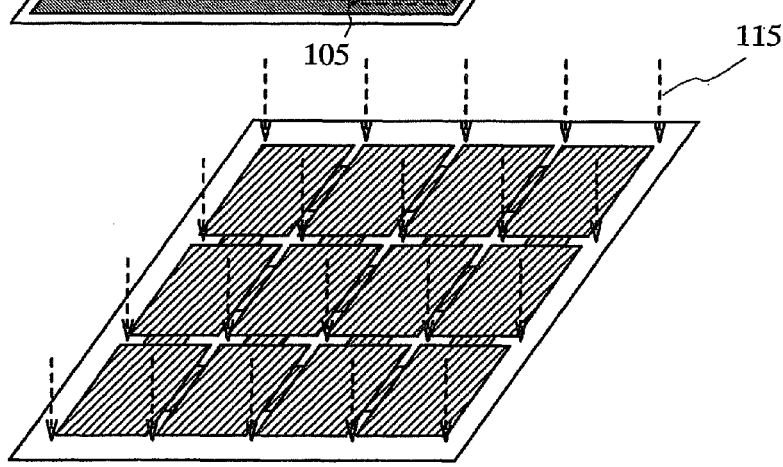

As shown in FIG. 8B, an etchant 115 is introduced into the groove 105 to remove the separation layer. A gas or liquid including halogen fluoride can be used as the etchant as in Embodiment Mode 1.

At this time, the reaction time and introduction quantity are adjusted so that the separation layer formed below the connection region 106 is also removed. When the etchant is introduced, the separation layer below the connection region recedes to be removed. Consequently, the insulating substrate 100 can be separated; however, the IDF chips are not separated from each other since they are connected with each other by the connection region 106.

The separated insulating substrate 100 can be reused as in Embodiment Mode 1.

Figure 8C:
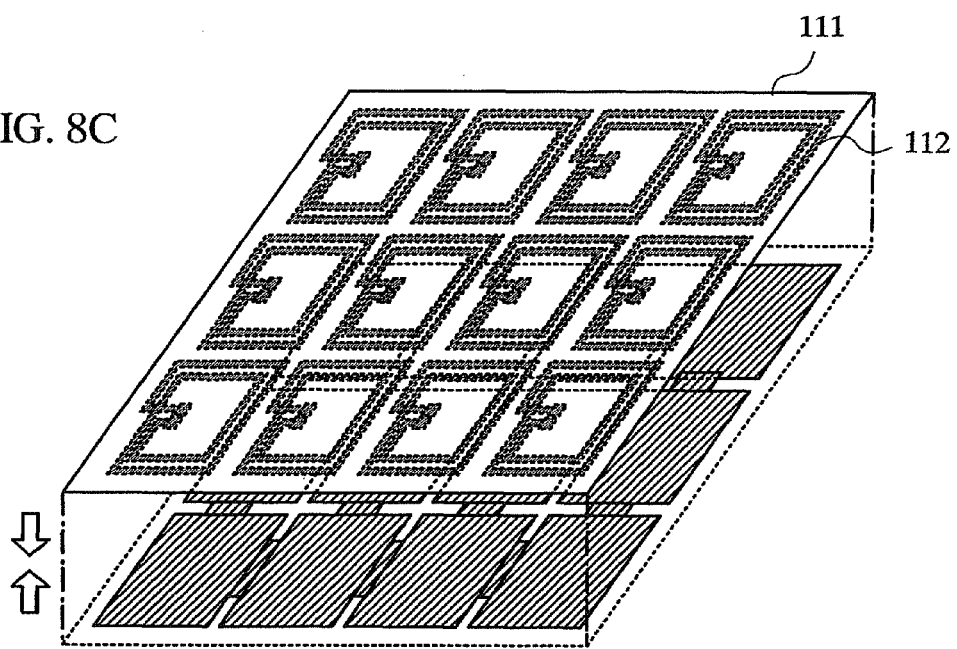

Thereafter, an antenna is formed if necessary as shown in FIG. 8C. An antenna 112 formed over an antenna substrate 111 is attached in this embodiment mode. At this time, the antenna substrate may not be provided with an opening. This is because introduction of the etchant is already completed.

Thereafter, the IDF chips are cut by a dicing, scribing, or laser cutting method. The IDF chips can be cut by using a laser which is absorbed by a glass substrate, such as a $CO_2$ laser. The periphery of the IDF chip such as a side face may be covered with an organic resin such as an epoxy resin as in Embodiment Mode 1.

The contactless IDF chip is described in this embodiment mode, but it may also be either a contact IDF chip or a hybrid IDF chip. This is because, even in the case of a contact IDF chip without an antenna, the separation of the IDF chips can be prevented by using not the antenna substrate but an insulating substrate where an antenna is not formed and the effect of the invention can be obtained.

In this embodiment mode, the IDF chip can be completed without being transferred to a transposition substrate. Therefore, the IDF chip can be reduced in thickness and weight, and the article mounted therewith can also be reduced in thickness and weight as a whole. The IDF chip may be transferred to a transposition substrate as in Embodiment Mode 1. As a result of transferring the IDF chip to the transposition substrate, the breaking strength of the IDF chip can be increased.

Embodiment Mode 3

A method using a mode in which the antenna substrate which is provided with an opening, described in Embodiment Mode 1, is attached to the insulating substrate which is provided with a connection region at the boundary between IDF chips, described in Embodiment Mode 2, is described in this embodiment mode.

Figure 20A:
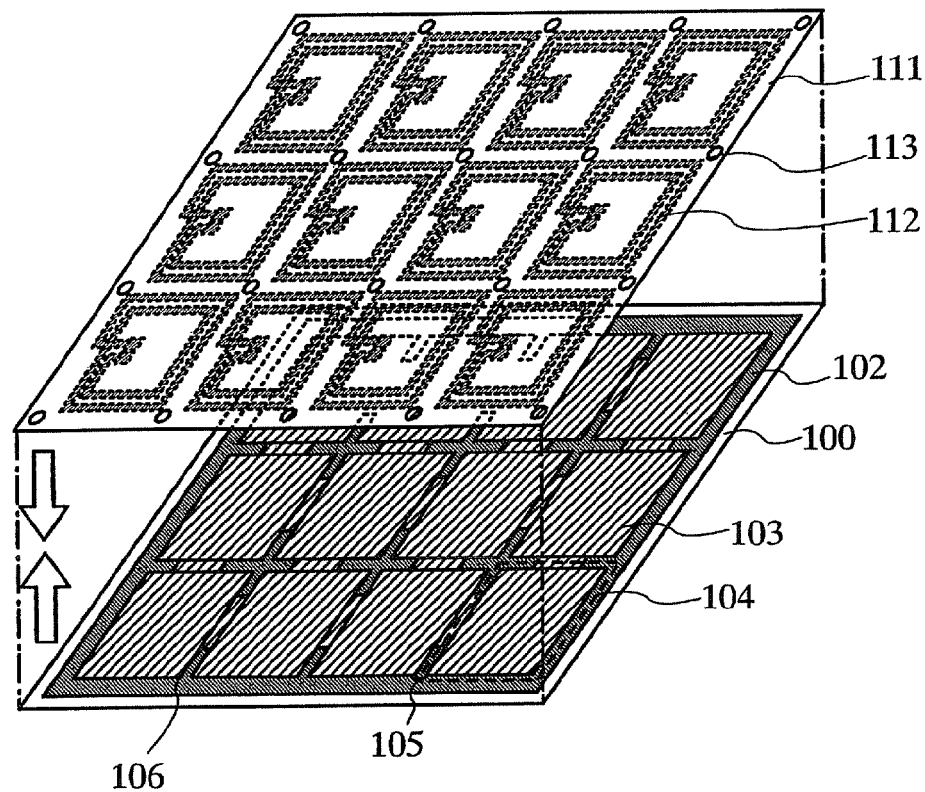
FIGS. 20A and 20B show a step of manufacturing a thin film integrated circuit

As shown in FIGS. 20A, a metal film 102 as a separation layer, and a TFT layer 103 are sequentially formed over an insulating substrate 100. Further, as the separation layer, a reactant having the metal is formed over the metal film 102. A groove 105 is selectively formed to have a connection region 106 between IDF chips 104, as in Embodiment Mode 2.

Thereafter, an antenna substrate 111 provided with an antenna 112 and an opening 113 is attached as in Embodiment Mode 1. At this time, the antenna substrate is attached so as to position the opening 113 to the groove 105.

Figure 20B:
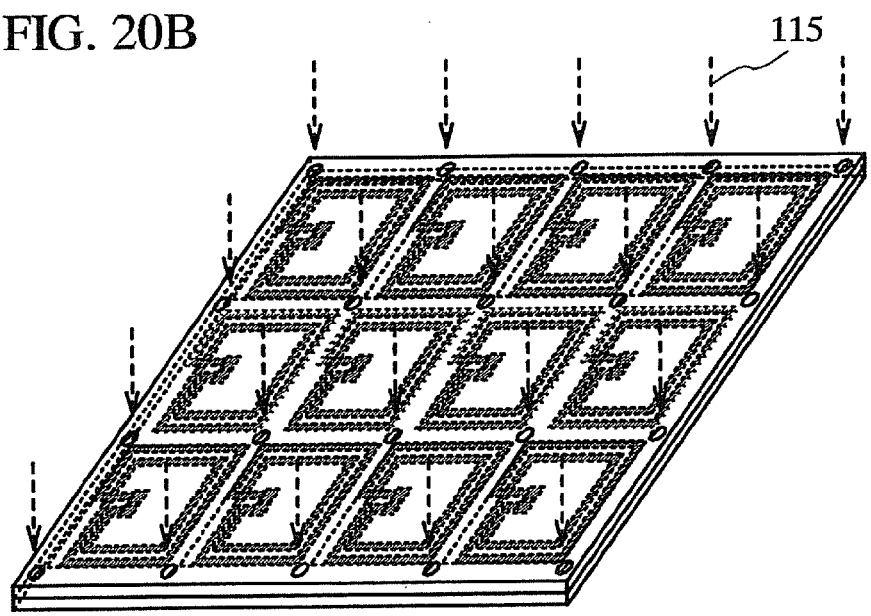

As shown in FIG. 20B, an etchant 115 is introduced into the opening and the groove. Then, the separation layer (the metal film and the reactant having the metal) is removed and the insulating substrate 100 can be separated. At this time, the IDF chips are not separated from each other since they are fixed and connected with each other by the connection region and the antenna substrate.

The case of introducing the etchant after attaching the antenna substrate is described in this embodiment mode; however, the etchant may be introduced before attaching the antenna substrate. Even in that case, the insulating substrate can be separated without separating the IDF chips from each other, since the IDF chips are connected with each other by the connection region.

Thereafter, the IDF chips are cut by a dicing, scribing, or laser cutting method. The IDF chips can be cut by using a laser which is absorbed by a glass substrate, such as a $CO_2$ laser.

Thereafter, the periphery of the IDF chip such as a side face may be covered with an organic resin such as an epoxy resin as in Embodiment Mode 1.

In this embodiment mode, the IDF chip can be completed without being transferred to a transposition substrate. However, the IDF chip may be transferred to a transposition substrate as in Embodiment Mode 1. As a result of transferring the IDF chip to the transposition substrate, the breaking strength of the IDF chip can be increased.

Embodiment

Embodiment 1

A specific method of the mode described in Embodiment Mode 1 is described in this embodiment.

Figure 2A:
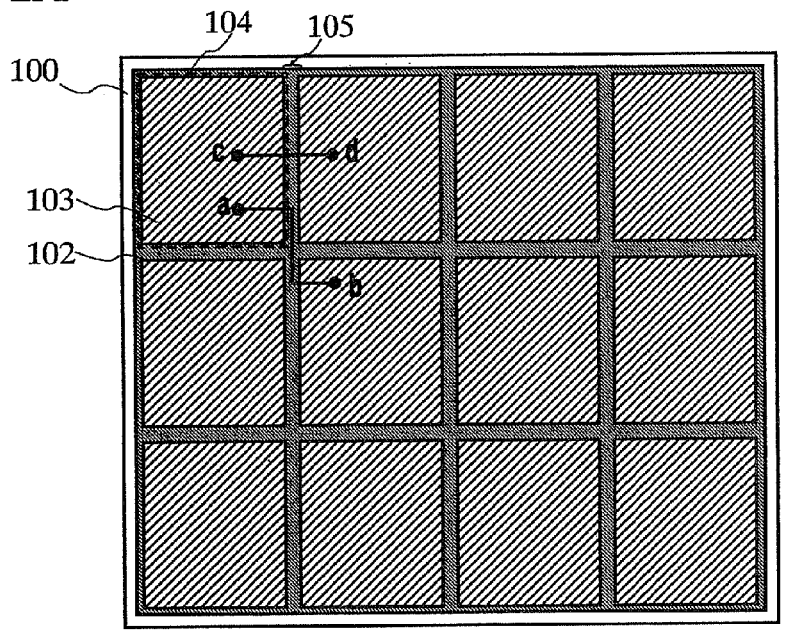
FIGS. 2A to 2C show a step of manufacturing a thin film integrated circuit.
Figure 2B:
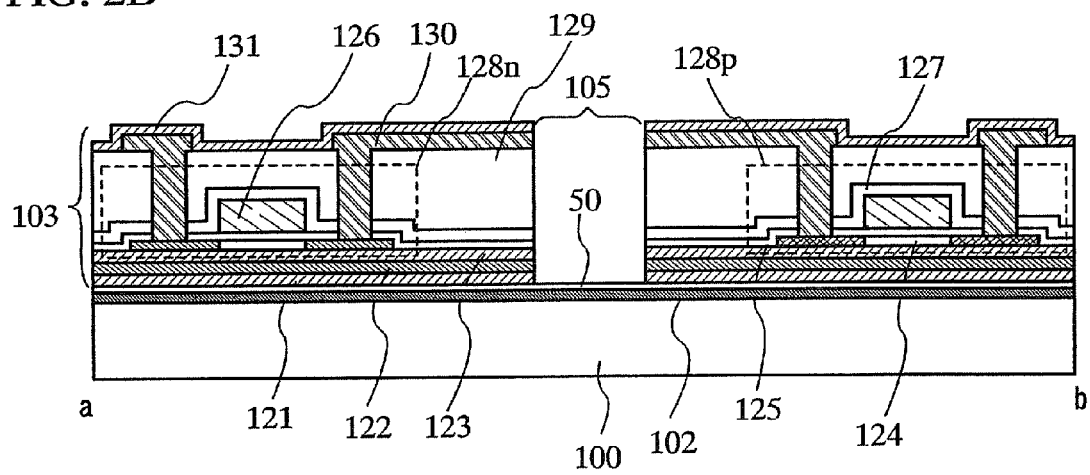
Figure 2C:
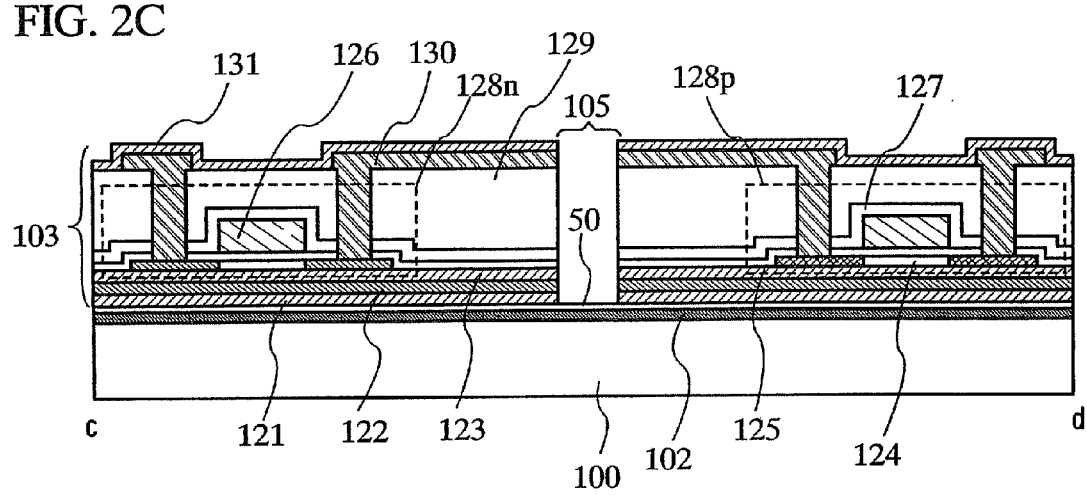

FIG. 2A is a top view in the case of forming 12 IDF chips over an insulating substrate 100, and FIG. 2B is a cross-sectional view of full line a-b from FIG. 2A.

As shown in FIG. 2B, a TFT layer formed over the insulating substrate 100 with a metal film 102 and a reactant 50 having the metal therebetween includes thin film transistors 128n and 128p, each having an insulating film, a semiconductor film 124 patterned into a desired shape, an insulating film which functions as a gate insulating film (hereinafter referred to as a gate insulating film) 125, and a conductive film which functions as a gate electrode (hereinafter referred to as a gate electrode) 126 which is formed over the gate insulating film. The semiconductor film includes a channel formation region and an impurity region (including a source region, a drain region, a GOLD region, and an LDD region) and can be divided into an n-channel thin film transistor 128n and a p-channel thin film transistor 128p depending on the conductivity of an added impurity element. The semiconductor film also includes a wiring 130 formed to connect to each impurity region.

In this embodiment, W is used for the metal film; however, another material described above may be used.

The insulating film may have a laminated structure and has a first insulating film 121, a second insulating film 122, and a third insulating film 123 in this embodiment. For example, a silicon oxide film is used as the first insulating film; a silicon oxynitride film, as the second insulating film; and a silicon oxide film, as the third insulating film.

The semiconductor film 124 may be in any condition of an amorphous semiconductor, semi-amorphous silicon (SAS) in which an amorphous state and a crystalline state are mixed, a microcrystalline semiconductor in which a crystal grain of 0.5 nm to 20 nm can be observed within an amorphous semiconductor, and a crystalline semiconductor.

In the case of using a substrate which can withstand a film formation processing temperature, for example, a quartz substrate, a crystalline semiconductor film can be formed over the substrate by a CVD method or the like.

In this embodiment, an amorphous semiconductor film is formed and heat-treated to form a crystallized crystalline semiconductor film. A heating furnace, laser irradiation, irradiation with light emitted from a lamp in place of laser light (hereinafter referred to as lamp annealing), or a combination thereof can be employed for the heat treatment.

A continuous wave laser (CW laser) or a pulsed wave laser (pulsed laser) can be used in the case of employing laser irradiation; one of or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser may be used. A crystal having a large grain size can be obtained by irradiation with a fundamental wave of the above laser and a second harmonic to a fourth harmonic of the fundamental wave. For example, a second harmonic (532 nm) or a third harmonic (355 nm) of an Nd:$YVO_4$ laser (fundamental wave of 1064 nm) can be used. Energy density of the laser at the time needs to be in the range of approximately 0.01

MW/cm$^2$ to 100 MW/cm$^2$ (preferably, 0.1 MW/cm$^2$ to 10 MW/cm$^2$). Then, laser irradiation is performed at scanning speed of approximately 10 cm/sec to 2000 cm/sec.

Figure 23A:
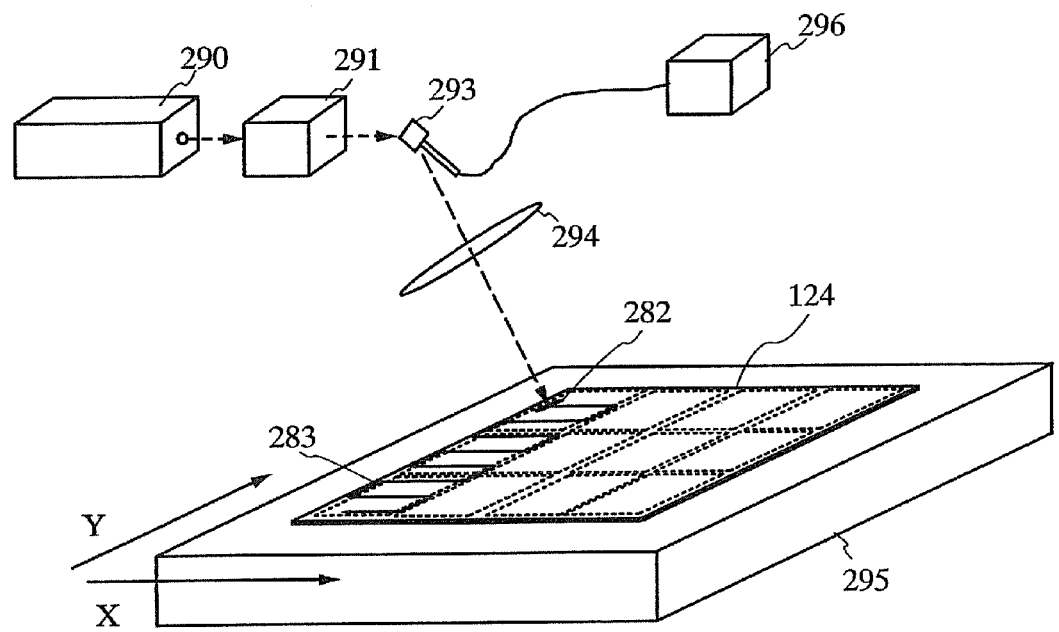
FIGS. 23A and 23B show a step of manufacturing a thin film integrated circuit.

For example, crystallization is performed using an optical system as shown in FIG. 23A and a CW laser First, a CW laser beam emitted from a laser oscillator 290 is elongated by an optical system 291 and is processed into a linear shape. Specifically, a laser beam can be processed into a linear shape when the laser beam passes a cylindrical lens or a convex lens included in the optical system 291. The laser beam is preferably processed to have a spot long axis length of 200 μm to 350 μm.

Thereafter, the laser beam processed into a linear shape enters the semiconductor film 124 through a galvanometer mirror 293 and an fθ lens 294. At this time, the linear laser is adjusted to form a laser spot 282 having a predetermined size on the semiconductor film. In addition, the fθ lens 294 can make the shape of the laser spot 282 constant on the surface of an irradiated object, regardless of the angle of the galvanometer mirror.

At this time, a device for controlling the vibration of the galvanometer mirror (control device) 296 vibrates the galvanometer mirror, in other words, changes the angle of the mirror. The laser spot 282 is moved in one direction (for example, in an X-axis direction in the figure) (outward). For example, when the galvanometer mirror vibrates in half cycle, the laser spot is moved in an X-axis direction on the semiconductor film by a certain width.

Then, the semiconductor film is moved in a Y-axis direction by an XY stage 295. The laser spot is moved in an X-axis direction on the semiconductor film by the galvanometer mirror in the same manner (homeward). With such back-and-forth movement of the laser beam, the laser spot is moved along a pathway 283 to perform the laser annealing on the entire semiconductor film.

Figure 23B:
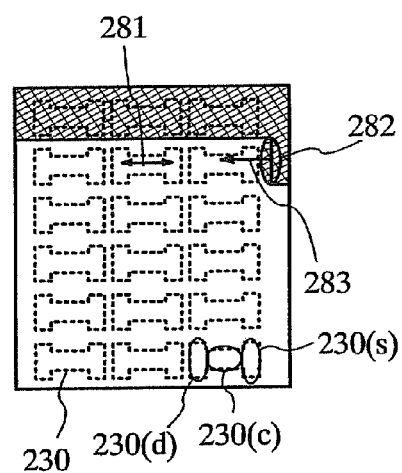

As shown in FIG. 23B, the laser annealing is performed on the thin film transistor so that a carrier flow direction 281 and a moving direction of the laser beam to a long axis (scanning direction) are in the same direction. For example, in the case of a semiconductor film 230 having such a shape as shown in FIG. 23B, a source region 230(*s*), a channel formation region 230(*c*), and a drain region 230(*d*) formed in the semiconductor film are arranged to be parallel to the moving direction of the laser beam to a long axis (scanning direction). Consequently, grain boundaries through which carriers pass can be reduced or eliminated; therefore, mobility of the thin film transistor can be improved.

In addition, the laser may have an incident angle θ (0°<θ<90°) to the semiconductor film. Consequently, laser interference can be prevented.

The semiconductor film may be irradiated with continuous wave laser light of a fundamental wave and continuous wave laser light of a harmonic, or may be irradiated with continuous wave laser light of a fundamental wave and pulsed wave laser light of a harmonic. Energy can be supplemented by irradiating with plural kinds of laser light.

In the case of the pulsed wave laser, pulsed laser may be oscillated with such a repetition rate that the laser of the next pulse is emitted after melting the semiconductor film and before solidifying the semiconductor film. This makes it possible to obtain crystal grains which are sequentially grown in the scanning direction. In other words, it is possible to use a pulsed beam with a low limit of a repetition rate that is set shorter than the time required for the melted semiconductor film to solidify.

Actually used is a pulsed beam with a repetition rate of 10 MHz or more which are much higher repetition rate than that of several tens to several hundreds Hz of a typically used pulsed beam.

The laser light irradiation may be performed in an inert gas atmosphere such as a noble gas or nitrogen. This can suppress roughness of a semiconductor surface due to the laser light irradiation and prevent variations in the threshold caused by variations in interface state density.

A microcrystalline semiconductor film may be formed by using $SiH_4$ and $F_2$, or $SiH_4$ and $H_2$ and be then irradiated with the laser as described above for crystallization.

In the case of using a heating furnace as another heat treatment, an amorphous semiconductor film is heated at temperatures of 500° C. to 550° C. for 2 to 20 hours. At this time, the temperature may be set in multiple stages in the range of 500° C. to 550° C. so as to gradually reach a higher temperature. This is because so-called dehydrogenation can be performed to reduce film roughness during crystallization, since hydrogen and the like of the amorphous semiconductor film are released at the first low temperature heating step. When a metal element which accelerates crystallization, for example, Ni, is further formed over the amorphous semiconductor film, the heat temperature can be lowered, which is preferable. Even in the case of using such a metal element, heat treatment may be performed at high temperatures of 600° C. to 950° C.

However, in the case of forming a metal element, there is concern that the metal element may adversely affect electric characteristics of a semiconductor element. Thus, a gettering step is required to reduce or remove the metal element. For example, such a step as to capture the metal element may be performed using the amorphous semiconductor film as a gettering sink.

Alternatively, a crystalline semiconductor film may be directly formed. In this case, the crystalline semiconductor film can be directly formed on a formation surface by utilizing heat or plasma with the use of a fluorine-based gas such as $GeF_4$ or $F_2$ and a silane-based gas such as $SiH_4$ or $Si_2H_6$. In the case of directly forming the crystalline semiconductor film as described above and requiring high temperature treatment, a quartz substrate that is highly heat resistant may preferably be used.

A semiconductor film formed by any of the above described methods contains more hydrogen than a chip formed with a silicon wafer. Specifically, the semiconductor film can be formed to contain hydrogen of $1 \times 10^{19}/cm^3$ to $1 \times 10^{22}/cm^3$, preferably, $1 \times 10^{19}/cm^3$ to $5 \times 10^{20}/cm^3$. The hydrogen can provide a so-called defect termination effect, which reduces defects in the semiconductor film. Further, the hydrogen can increase flexibility of the IDF chip.

Further, damage or separation of the thin film transistor due to bending stress can be prevented by making a ratio of an area of the patterned semiconductor film in the IDF chip 1% to 30%.

The thin film transistor having a semiconductor film has a subthreshold coefficient (S-value) of 0.35 V/dec or less, preferably, 0.25 V/dec to 0.09 V/dec. In addition, the thin film transistor has mobility of 10 cm$^2$V/sec or more.

When a 19-stage ring oscillator is formed using such TFTs, a repetition rate thereof is 1 MH or more, preferably, 100 MHz or more at a power supply voltage of 3 V to 5V. The delay time per stage of an inverter is 26 ns, preferably, 0.26 ns or less at a power supply voltage of 3 V to 5 V.

According to the above described structure, a function as a TFT can be obtained, but a first interlayer insulating film 127 and a second interlayer insulating film 129 are preferably formed. Damage, defects, or the like of the semiconductor film can be repaired with hydrogen from the first interlayer insulating film. In other words, a termination effect of defects due to hydrogen can be obtained. An insulating film containing oxygen or nitrogen such as a silicon oxide (SiOx) film, a silicon nitride (SiNx) film, a silicon oxynitride (SiOxNy) (x>y) film, or a silicon nitride oxide (SiNxOy) (x>y) (x, y=1, 2 . . .) film can be used as the first interlayer insulating film.

Planarity can be improved by the second interlayer insulating film. An organic material or an inorganic material can be used for the second interlayer insulating film. Polyimide, acrylic, polyamide, polyimide amide, a resist, benzocyclobutene, siloxane, or polysilazane can be used as an organic material. Siloxane corresponds to a resin including a Si—O—Si bond. A skeletal structure of siloxane is configured by a bond of silicon (Si) and oxygen (O). As a substituent, an organic group containing at least hydrogen (for example, an alkyl group or aromatic hydrocarbon) is used. Alternatively, a fluoro group may be used. Further, an organic group containing at least hydrogen and a fluoro group may be used as a substituent. Polysilazane is formed by using as a starting material a liquid material including a polymer material having a bond of silicon (Si) and nitrogen (N). An insulating film containing oxygen or nitrogen such as a silicon oxide (SiOx) film, a silicon nitride (SiNx) film, a silicon oxynitride (SiOxNy) (x>y) film, or a silicon nitride oxide (SiNxOy) (x>y) (x, y=1, 2 . . . ) film can be used as an inorganic material. In addition, a laminated structure of the insulating films described above may be used for the second interlayer insulating film. When the second interlayer insulating film is formed by using an organic material, planarity is improved, whereas moisture and oxygen are absorbed by the organic material. An insulating film having an inorganic material is preferably formed over the insulating film having an organic material in order to prevent that. When an insulating film containing nitrogen is used for the inorganic material, entry of alkali ions such as Na can be prevented.

More preferably, a fourth insulating film 131 is provided to cover the wiring 130. Since an article mounted with the IDF chip is often touched by bare hands, there is concern of diffusion of alkali ions such as Na. Therefore, the fourth insulating film is preferably formed on the top surface of the IDF chip. An insulating film containing oxygen or nitrogen such as a silicon oxide (SiOx).film, a silicon nitride (SiNx) film, a silicon oxynitride (SiOxNy) (x>y) film, or a silicon nitride oxide (SiNxOy) (x>y) (x, y=1, 2 . . . ) film can be used as the fourth insulating film. Typically, a silicon nitride oxide (SiNxOy) film is preferably used. This is because entry of alkali ions such as Na can be prevented when an insulating film containing nitrogen such as a silicon nitride oxide film is used.

Thereafter, a groove 105 is formed between the IDF chips 104. The groove 105 can be formed by dicing, scribing, etching with the use of a mask, or the like. A blade dicing method with a dicing apparatus (dicer) is commonly employed for dicing. The blade is a grinding stone into which a diamond abrasive grain is embedded, and has widths of approximately 30 μm to 50 μm. The TFT layer is separated by rapidly spinning the blade. A diamond scribing method, a laser scribing method, or the like is used for scribing. In the case of etching, the TFT layer can be separated by dry etching, wet etching, or the like after forming a mask pattern by a light exposure step and a development step. In dry etching, an atmospheric plasma method may be used. Thus, a groove is formed between the IDF chips.

Note that the groove need not necessarily be formed at every boundary between the IDF chips, but it may be formed at intervals of boundaries between the IDF chips.

Figure 3A:
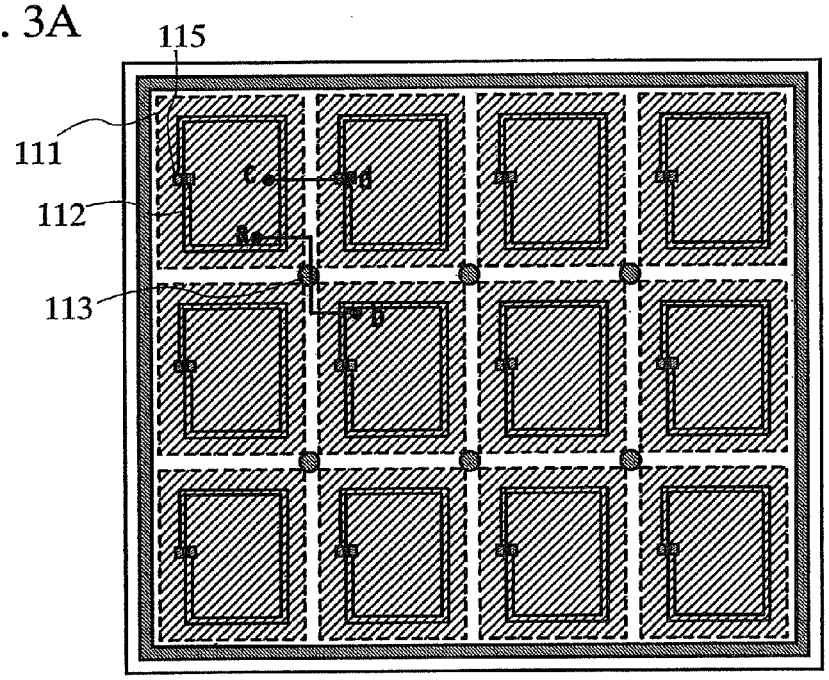
FIGS. 3A to 3C show a step of manufacturing a thin film integrated circuit.
Figure 3B:
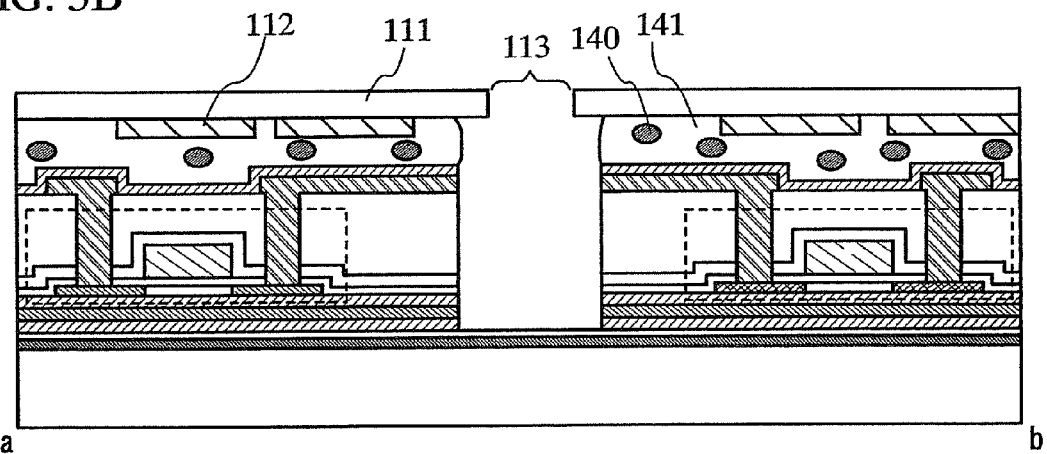
Figure 3C:
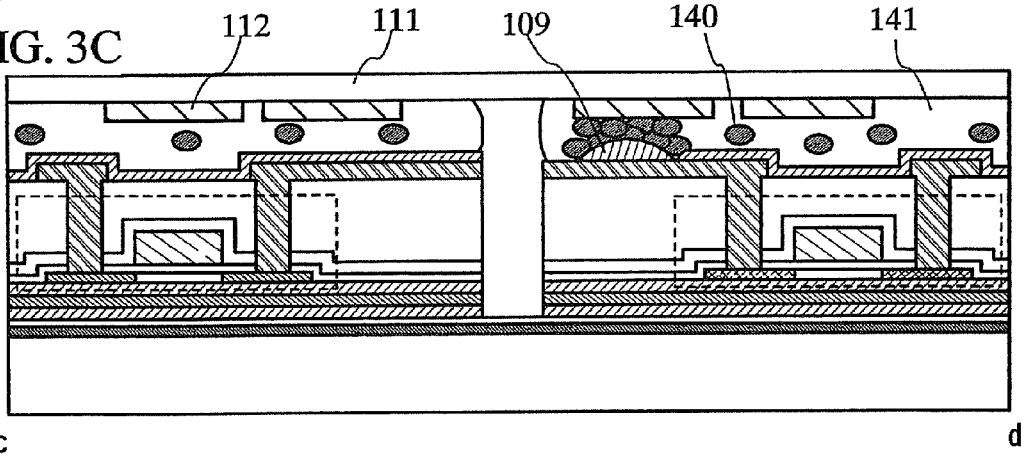

Subsequently, an antenna substrate is attached as shown in FIGS. 3A to 3C. FIG. 3A is a top view with an antenna substrate 111 attached, and FIG. 3B is a cross-sectional view of full line a-b from FIG. 3A.

An anisotropic conductor 141 including dispersed conductors 140 can be used as an attaching means. The anisotropic conductor can electrically join a connection terminal of the IDF chip to a connection terminal of the antenna since the conductors are bonded to each other by pressure due to the thickness of each connection terminal. A region other than the connection terminals remains nonconductive since sufficient distance is kept between the conductors. Instead of an anisotropic conductor, the antenna substrate may be attached with the use of an ultrasonic adhesive, an ultraviolet curing resin, two-sided tape, or the like in which a conductor is dispersed.

The antenna substrate 111 is provided with an antenna 112 and an opening 113. The position of the antenna corresponds to the IDF chip. As shown in FIG. 3B, the position of the opening 113 corresponds to the groove 105. Detailed manufacturing steps of the antenna and the opening are described below.

In this embodiment, the openings are formed at every boundary between the antennas; however, they may be formed at intervals of boundaries. Further, the case of the opening having a circular shape is also described in this embodiment; however, the shape is not limited thereto. The opening may be formed to have, for example, a slit shape. As described above, the shape and the position of the groove 105 and the opening 113 can be appropriately set.

Figure 4A:
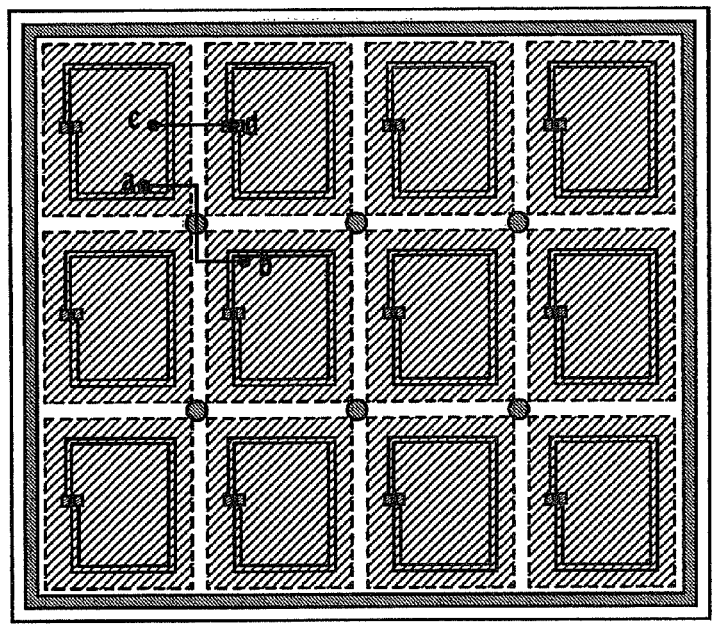
FIGS. 4A to 4C show a step of manufacturing a thin film integrated circuit.
Figure 4B:
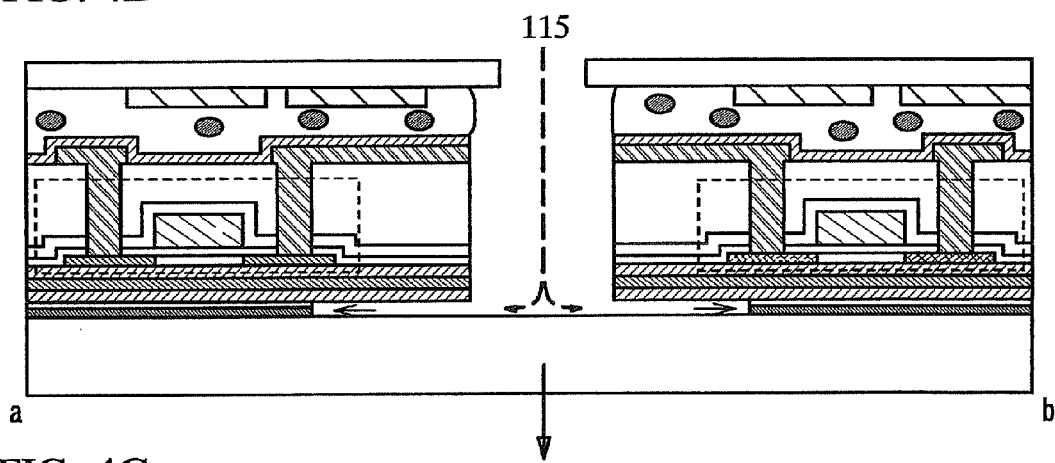
Figure 4C:
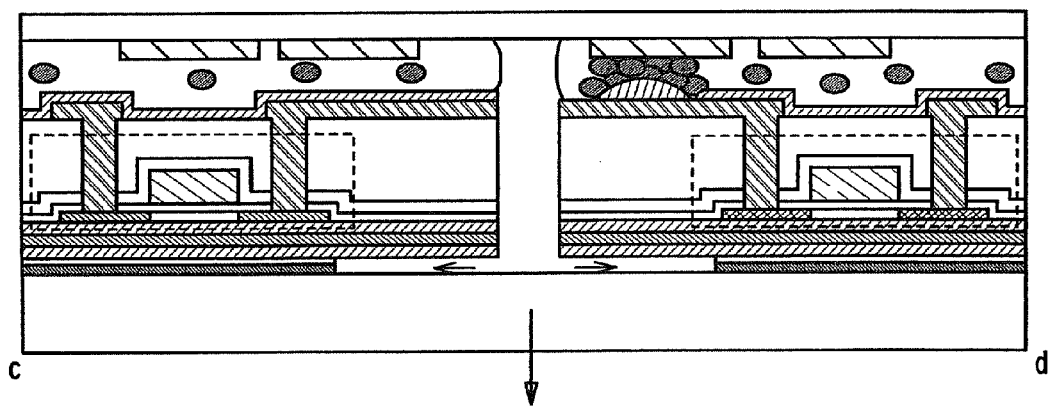
Figure 24:
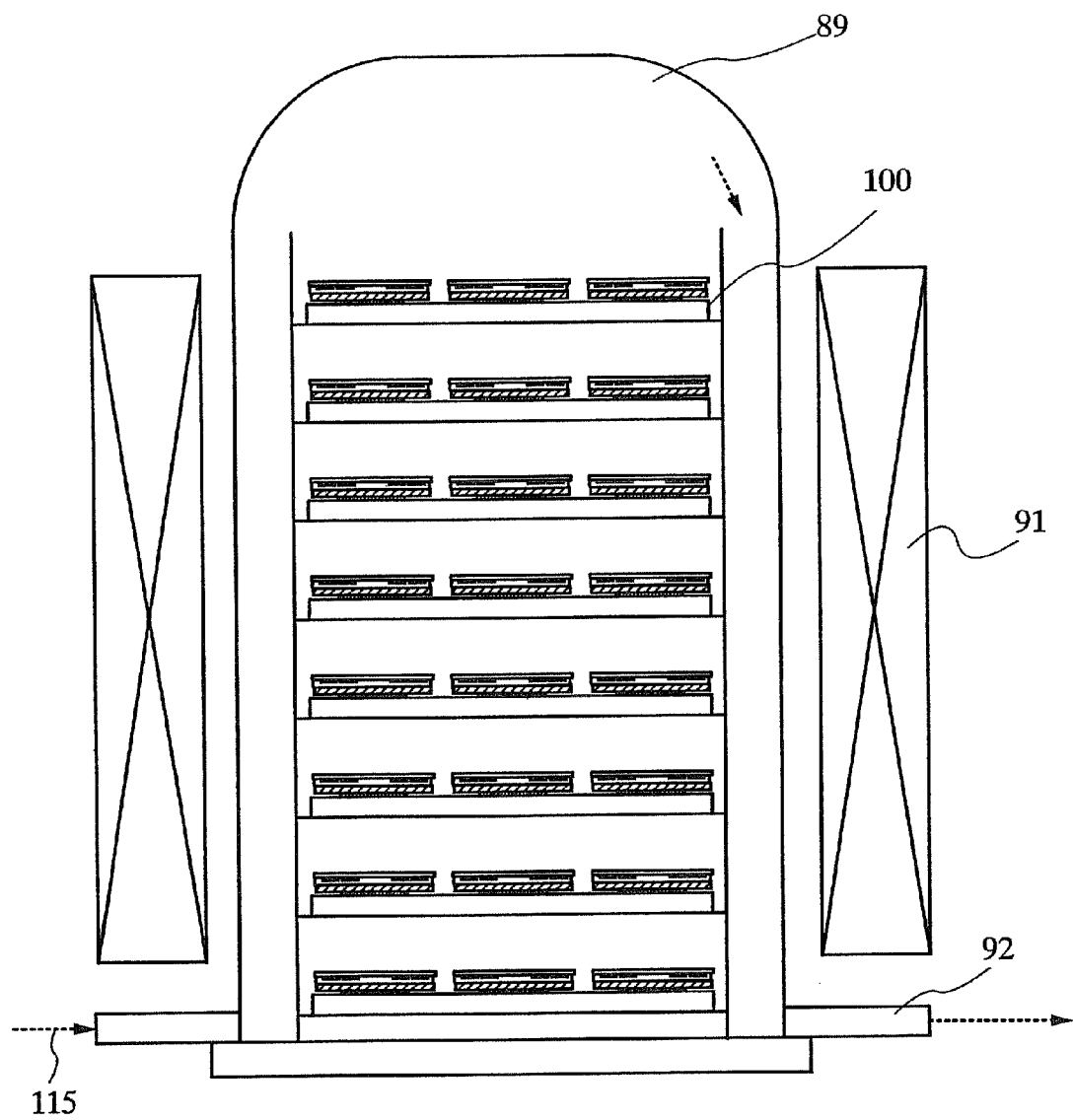
FIG. 24 shows a manufacturing apparatus of a thin film integrated circuit.

Subsequently, the separation layer (the metal film and the reactant) is removed by introducing a gas or liquid containing halogen fluoride as an etchant as shown in FIGS. 4A to 4C. Here, the separation layer is removed using a low pressure CVD apparatus, shown in FIG. 24, under the following conditions: gas, ClF$_3$ (chlorine trifluoride); temperature, 350° C.; flow rate, 300 sccm; pressure, 6 Torr; and time, 3 hours. However, the condition is not limited thereto. The low pressure CVD apparatus shown in FIG. 24 has a bell jar 89 which enables treatment of a plurality of insulating substrates 100. ClF$_3$ 115 is introduced through a gas introduction pipe, and unnecessary gas is expelled through an exhaust pipe 92. At this time, there is no possibility that the IDF chips are drawn into the exhaust pipe 92 since the IDF chips are connected with each other by the antenna substrate. Further, a heating means, for example, a heater 91 may be provided on the side face of the low pressure CVD apparatus.

FIG. 4A is a top view showing a state of introducing a gas or liquid containing halogen fluoride to remove a separation layer, and FIG. 4B is a cross-sectional view of full line a-b from FIG. 4A.

FIG. 4B shows the state of introducing a gas or liquid containing halogen fluoride into an opening 113 and a groove 105. When a processing temperature is in the range of 100° C. to 300° C. using a heating means, the reaction rate can be increased. Consequently, consumption of ClF$_3$ gas can be reduced and processing time can be shortened.

The separation layer gradually recedes by introducing an etchant in this manner. Then, the insulating substrate can be separated and removed as indicated by the arrow.

An etchant, gas flow rate, temperature, and the like are determined so that each layer of the TFT is not etched. And an insulating film containing oxygen or nitrogen is used as the base film. Since difference in the reaction rate between the separation layer and the base film is large, meaning that the selectivity is high, the separation layer can be easily removed with the IDF chip protected. In this embodiment, the TFT layer is hard to be etched by $ClF_3$ due to the base film and a protective film which are provided above and below the TFT layer and edge portions of the interlayer insulating film, the gate insulating film, the wiring, and the like which are exposed on the side face.

Note that $ClF_3$ can be generated through a process of $Cl_2$ $(g)+3F_2(g) \rightarrow 2ClF_3(g)$ by the reaction of chlorine with fluorine at temperatures of 200° C. or more. $ClF_3$ (boiling point: 11.75° C.) may be liquid in some cases depending on the temperature of the reaction field. In that case, wet etching can also be employed using $ClF_3$ as the liquid containing halogen fluoride.

A gas of $ClF_3$ or the like mixed with nitrogen may be used as another gas containing halogen fluoride.

The etchant is not limited to $ClF_3$ or halogen fluoride as long as it etches the separation layer and it does not etch the base film. For example, a plasma gas containing fluorine such as $CF_4$, $SF_6$, $NF_3$, or $F_2$ can be used. A strong alkaline solution such as tetraethylammonium hydroxide (TMAH) may be used as another etchant, and a solution of HF or the like may be used.

The combination of the separation layer and the base film is not limited to the above-described material as long as the material that is selectively etched is used for the separation layer and a material that is not etched is used for the base film in the case of chemically removing the separation layer with a gas containing halogen fluoride such as $ClF_3$.

Even when the insulating substrate is removed as described above, the IDF chips are connected with each other by the antenna substrate. Thereafter, the IDF chips are cut by a dicing, scribing, or laser cutting method, thereby completing the IDF chip. Then, the IDF chip may be mounted on an article. A thermosetting resin, an ultraviolet curing resin, an epoxy resin, a resin additive, two-sided tape, or the like can be used as an adhesive for mounting.

Figure 5A:
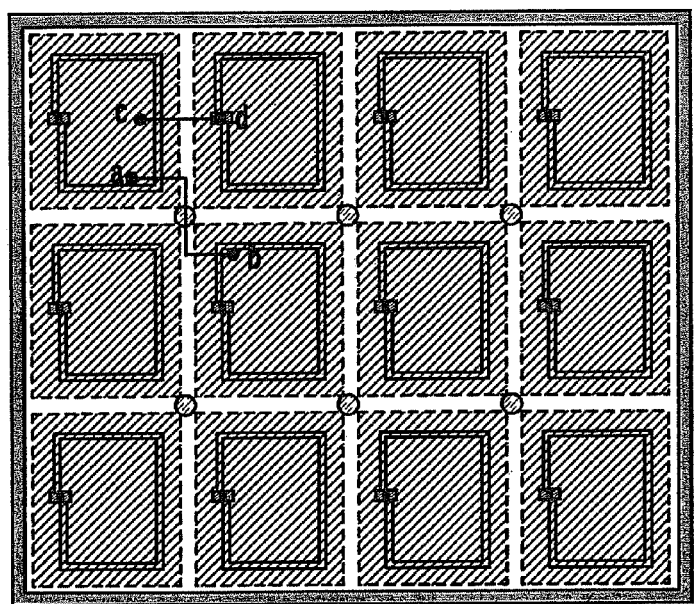
FIGS. 5A to 5C show a step of manufacturing a thin film integrated circuit.
Figure 5B:
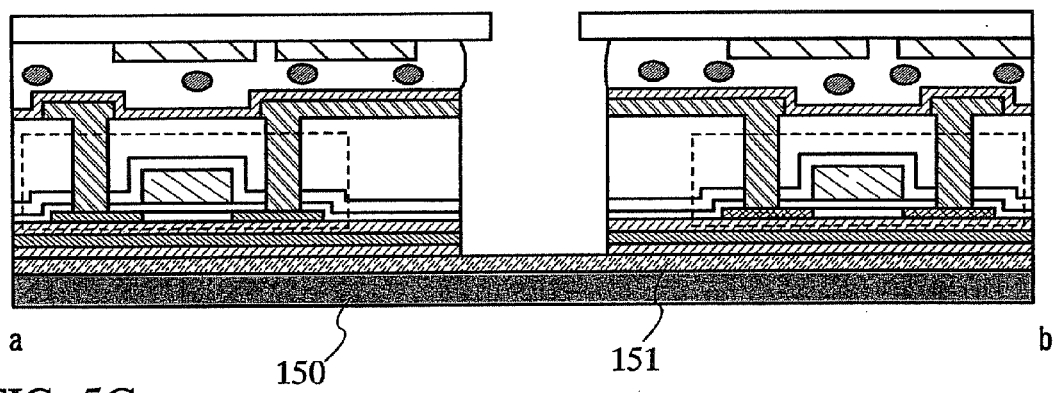
Figure 5C:
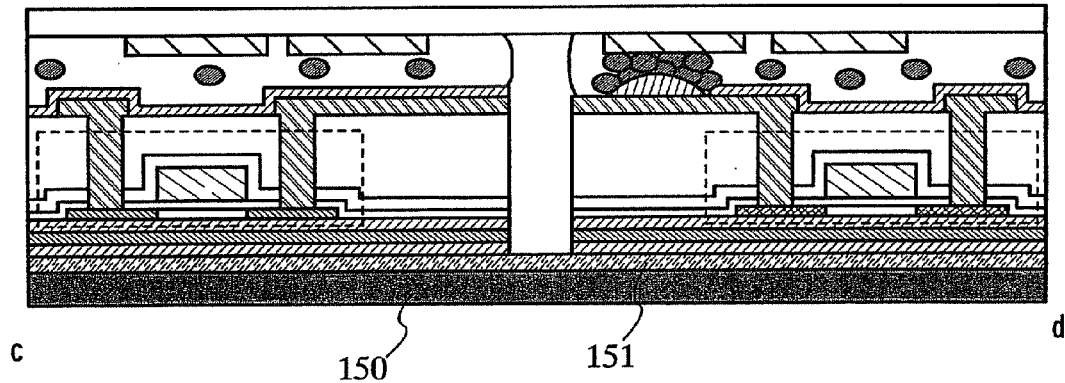

Although the IDF chip can be completed according to the above-described step, a flexible substrate may be attached as shown in FIGS. 5A to 5C. FIG. 5A is a top view showing a state of attaching a flexible substrate 150 with an adhesive 151, and FIG. 5B is a cross-sectional view of full line a-b from FIG. 5A.

A substrate made from a synthetic resin such as plastic as described above or acrylic can be used as the flexible substrate. In this embodiment, a substrate made from plastic is used.

The breaking strength of the IDF chip can be increased by transferring the IDF chip to the flexible substrate.

Figure 6A:
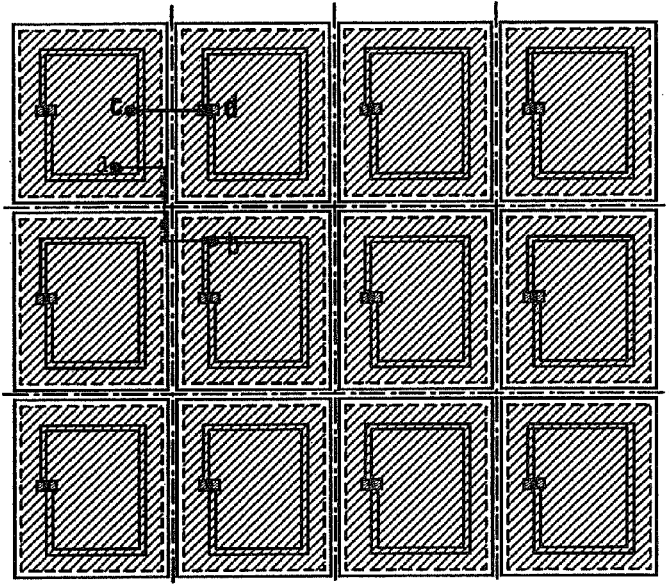
FIGS. 6A to 6C show a step of manufacturing a thin film integrated circuit.
Figure 6B:
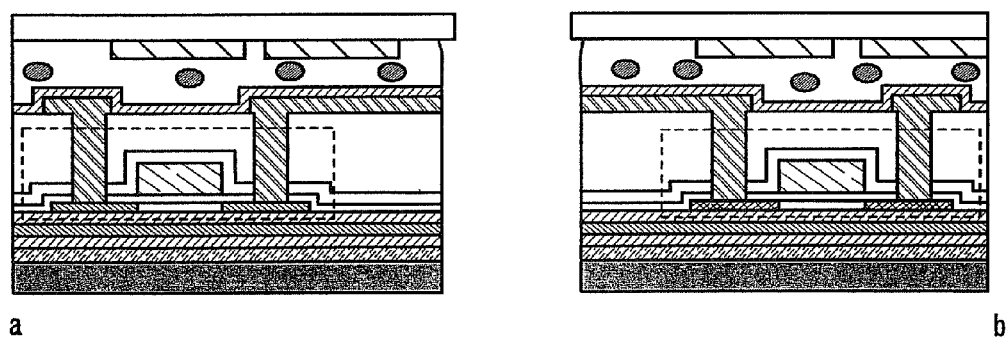
Figure 6C:
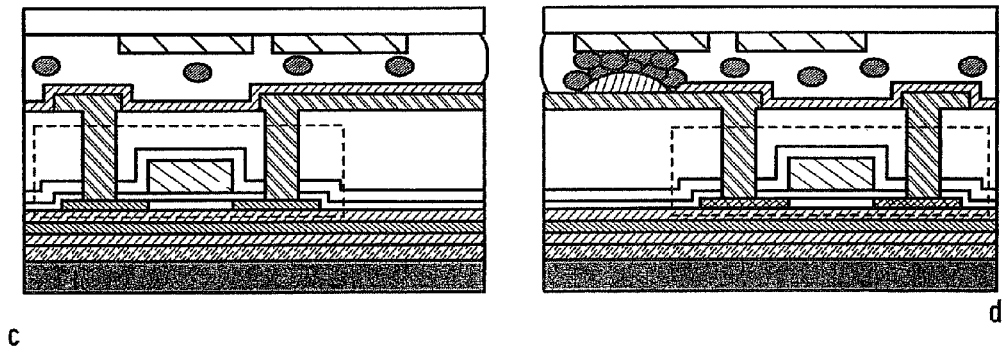

The IDF chips are cut by a dicing, scribing, or laser cutting method as shown in FIGS. 6A to 6C, thereby completing the IDF chip formed over the flexible substrate. FIG. 6A is a top view showing the state of the cut IDF chip, and FIG. 6B is a cross-sectional view of full line a-b from FIG. 6A.

The thus formed IDF chip may be mounted on an article. A thermosetting resin, an ultraviolet curing resin, an epoxy resin, a resin additive, two-sided tape, or the like can be used as an adhesive for mounting.

The IDF chips which are connected with each other until just before being completed in this manner can reduce the complexity of handling separated IDF chips. They may be connected with each other until just before being mounted on an article. For example, the IDF chips are cut only in one direction in line and placed on an IDF chip mounting apparatus, and then cut in the other direction at the time of mounting on an article. This makes it possible to reduce the complexity of handling separated IDF chips and to easily mount the IDF chips.

Although not shown, the IDF chip may be covered with a resin or an insulating film containing nitrogen for protection, and in particular, the side face of the IDF chip is preferably covered therewith. Protecting the IDF chip improves portability of the IDF chip. The resin or the insulating film containing nitrogen can be made from the same material as that of the article to be mounted with the IDF chip.

In this embodiment, the IDF chip is mounted using an anisotropic conductor in a "face-down" manner, where the connection terminal of the IDF chip faces the antenna, as described above; however, the IDF chip may be mounted in a "face-up" manner, where the connection terminal faces in the opposite direction to the antenna. In the case of mounting in a "face-up" manner, a wire bonding method can be used as a means of connecting the connection terminal to the antenna.

Hereinabove described is the mode in which a thin film transistor is formed over the insulating substrate, the insulating substrate is then separated, and preferably, the thin film transistor is further transferred to a flexible substrate. However, the timing or the number of separations is not limited to this embodiment. A position to which the thin film transistor is transferred is not limited to the flexible substrate. For example, the thin film transistor may be directly transferred to an article to be mounted with the IDF chip (mount article). The mounting of the IDF chip in a "face-up" manner or a "face-down" manner is determined in accordance with the number of transfers.

Figure 7A:
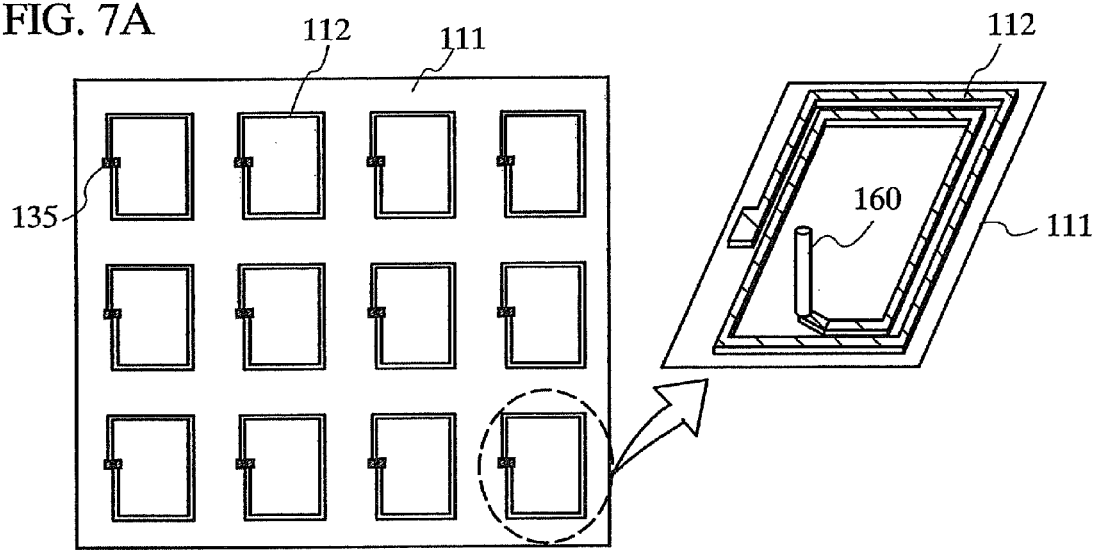
FIGS. 7A and 7B show a step of manufacturing an antenna.
Figure 7B:
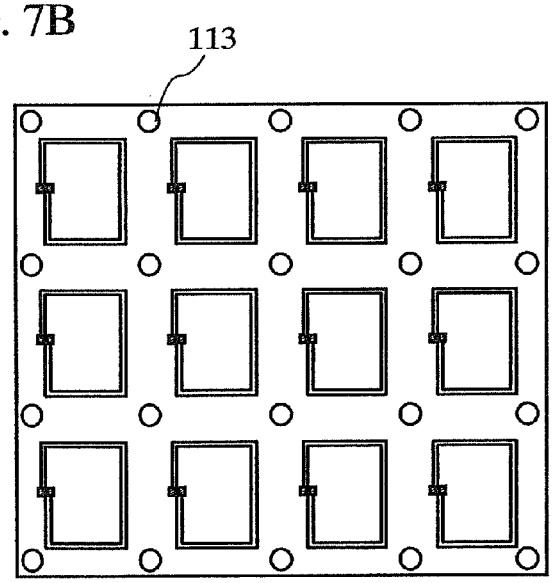

Subsequently, a step of manufacturing an antenna is described with reference to FIGS. 7A and 7B. FIGS. 7A and 7B show the case of forming a rectangularly winding antenna over an antenna substrate; however, the shape of the antenna is not limited thereto. For example, the antenna may be circular or linear.

A glass substrate such as a bariumborosilicate glass substrate or an aluminoborosilicate glass substrate; a quartz substrate; or a substrate made of a synthetic resin such as plastic typified by polyethyleneterephthalate (PET), polyethylenenaphthalate (PEN), or polyetersulfone (PES) or acrylic can be used as the antenna substrate. Since the antenna substrate is preferably thin, a film substrate is preferred.

As shown in FIG. 7A, an antenna 112 is formed over an antenna substrate 111 by a droplet discharge method with the use of a nozzle 160. The antenna can be formed by any one of the following methods: a sputtering method, a printing method, a plating method, a photolithography method, an evaporation method with the use of a metal mask, and a combination thereof, in lieu of a droplet discharge method. For example, a first antenna is formed by a sputtering method, a droplet discharge method, a printing method, a photolithography method, or an evaporation method, and a second antenna is formed to be covered with the first antenna by a plating method, thereby forming a laminated antenna. It is preferable to form the antenna by a droplet discharge method or a printing method since a conductive film need not be patterned, thereby reducing the number of manufacturing steps.

In addition, the antenna is provided with a connection terminal 135. The antenna can be easily connected with a thin film integrated circuit due to the connection terminal. The connection terminal can be formed by increasing droplets discharged from the nozzle or keeping the nozzle in one position. Note that the connection terminal need not necessarily be provided and the shape and the position thereof are not limited to this embodiment.

The antenna can be formed from a conductive material such as Ag (silver), Al (aluminum), Au (gold), Cu (copper), or Pt (platinum). In the case of using Al or Au, which has relatively high resistance, the wiring resistance may be a concern. However, the wiring resistance can be reduced by thickening the antenna or widening the antenna in the case that a large area is occupied by the antenna. The antenna may be covered with a material having low resistance and be a laminated antenna. In the case of using a conductive material such as Cu, which may diffuse, an insulating film may be formed to cover the formation surface of the antenna and/or the periphery of Cu.

In this embodiment, Ag mixed into tetradecane as a solvent is dropped from the nozzle 160 to form the antenna. At this time, a base film made from titanium oxide (TiOx) may be formed over the antenna substrate to improve adhesion of Ag.

More preferably, pressure is applied to the antenna after the formation to improve the planarity. Accordingly, the antenna can be thinned. A heating means as well as a pressurizing means may be provided, and in that case, pressure treatment and heat treatment can be performed at one time. The heat treatment may be combined with heat treatment for removing the solvent when needed in the case of using a droplet discharge method.

In addition, a groove (depression) may be formed on the antenna substrate, and the antenna may be formed in the groove. Since the antenna can be formed in the groove, the antenna substrate and the antenna can be thinned.

Further, the antenna can be formed on both sides of the antenna substrate. In that case, the antenna may be formed on the other side of the antenna substrate by a method similar to that described above. Accordingly, antenna length can be extended, which can increase the communication distance.

A part of the antenna may be formed on the other side of the antenna substrate, depending on the placement of the connection terminal. For example, when the antenna is coiled as shown in FIGS. 1A and 1B, it becomes necessary for a part of the antenna to intersect with another part of the antenna depending on the placement of the connection terminal. At this time, an insulator needs to be interposed so as not to short the antennas. However, the antenna substrate can be used as the insulator.

Subsequently, an opening 113 is formed in the antenna substrate as shown in FIG. 7B. The opening can be formed physically or chemically. In the case of physically forming the opening, a laser can be used. In addition, heat may be applied in order to easily form the opening, and the opening can be formed by sticking a hot needle or the like into the antenna substrate. In the case of chemically forming the opening, an etching method such as dry etching or wet etching can be used.

The shape of the opening is not limited to a circle, and may be a rectangle or the like.

The case of attaching the antenna to the IDF chip is described in this embodiment; however, the antenna may be directly formed over the IDF chip. For example, the antenna can be formed in the same layer as the wiring 130.

The contactless IDF chip is described in this embodiment; however, it may be either a contact IDF chip or a hybrid IDF chip.

The IDF chip and the antenna substrate are described as thick in this embodiment to make the embodiment easy to understand. However, they are actually formed very thinly.

Embodiment 2

A specific method of the mode described in Embodiment Mode 2 is described in this embodiment.

Figure 9A:
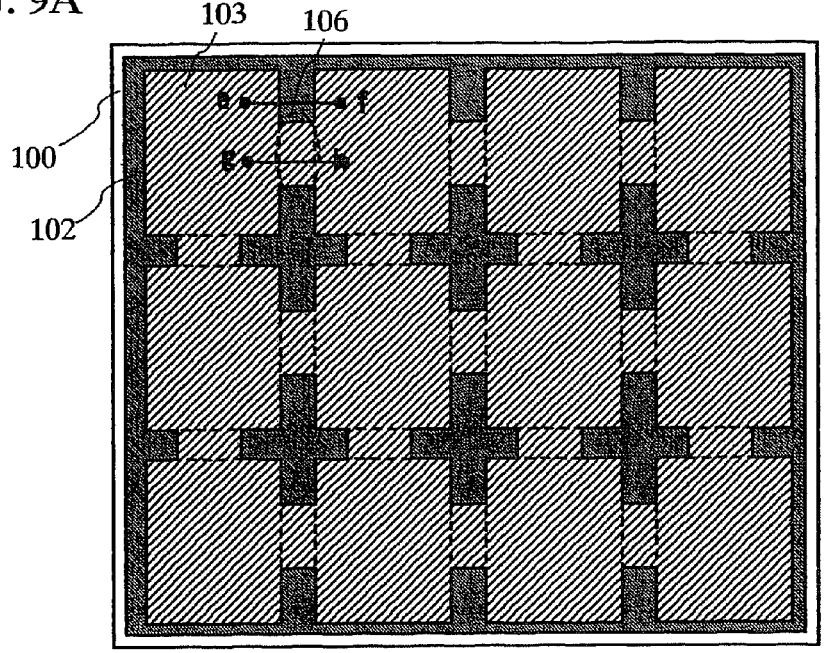
FIGS. 9A to 9C show a step of manufacturing a thin film integrated circuit.
Figure 9B:
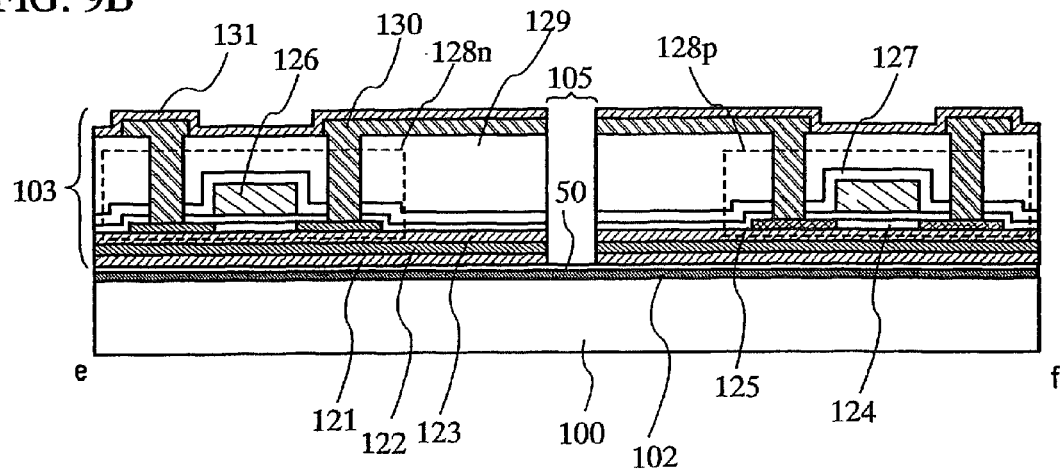
Figure 9C:
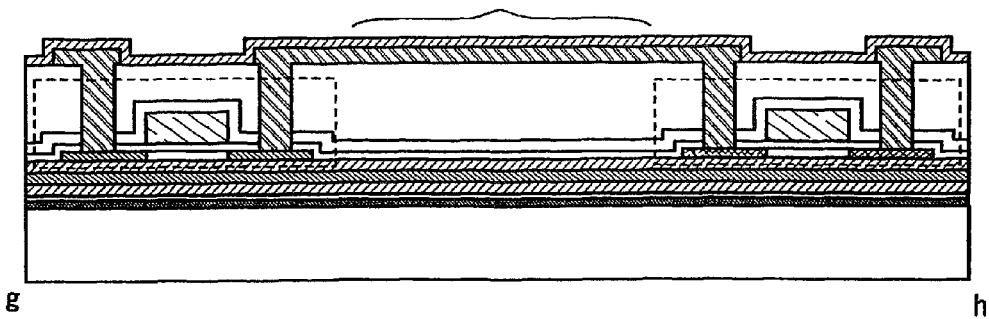

FIG. 9A is a top view of 12 IDF chips over an insulating substrate 100, FIG. 9B is a cross-sectional view of full line e-f from FIG. 9A, and FIG. 9C is a cross-sectional view of full line g-h from FIG. 9A, which crosses a connection region 106. Note that W is used for a metal film in this embodiment as in Embodiment 1.

As shown in FIG. 9B, a metal film 102 and a reactant 50 having the metal are formed over the insulating substrate 100 as a separation layer. With the metal film 102 and the reactant having the metal 50 therebetween, thin film transistors 128$n$ and 128$p$, each having a base film, a semiconductor film 124 patterned into a desired shape, a gate insulating film 125, and a gate electrode 126, are formed over the insulating substrate 100. In addition, a wiring 130 is provided to connect to an impurity region included in the semiconductor film.

The base film may have a laminated structure. Here, the base film has a first insulating film 121, a second insulating film 122, and a third insulating film 123 as in Embodiment 1.

As in Embodiment 1, the semiconductor film can be formed to contain hydrogen of $1 \times 10^{19}/cm^3$ to $1 \times 10^{22}/cm^3$, preferably, $1 \times 10^{19}/cm^3$ to $5 \times 10^{20}/cm^3$, unlike a chip formed with a silicon wafer. The hydrogen can provide a so-called defect termination effect, which reduces defects in the semiconductor film. Further, the hydrogen in the semiconductor film can increase flexibility of the IDF chip.

Further, damage or separation due to bending stress of the thin film transistor can be prevented by making a ratio of an area of the patterned semiconductor film in the IDF chip 1% to 30%.

In addition, a first interlayer insulating film 127 and a second interlayer insulating film 129 may be provided as in Embodiment 1. More preferably, a fourth insulating film 131 may be provided to cover the wiring 130.

Thereafter, a groove 105 is selectively formed to leave a connection region 106 in this embodiment. The groove 105 can be formed by dicing, scribing, etching with the use of a mask, or the like as in Embodiment 1. In the case of selectively forming the groove 105 to leave the connection region 106 as shown in FIG. 9C, the groove may be formed by dry etching, wet etching, or the like, after forming a mask pattern by a light exposure step and a development step. In dry etching, an atmospheric plasma method may be used.

In the case of forming the groove by dry etching, wet etching, or the like, conditions such as etching time of the groove can be adjusted in accordance with the placement or the shape of the connection region. Short-time etching can reduce influences on other films.

Thus, the groove formed between the IDF chips need not necessarily be formed at every boundary between the IDF chips, but may be formed at intervals of boundaries between the IDF chips.

Figure 10A:
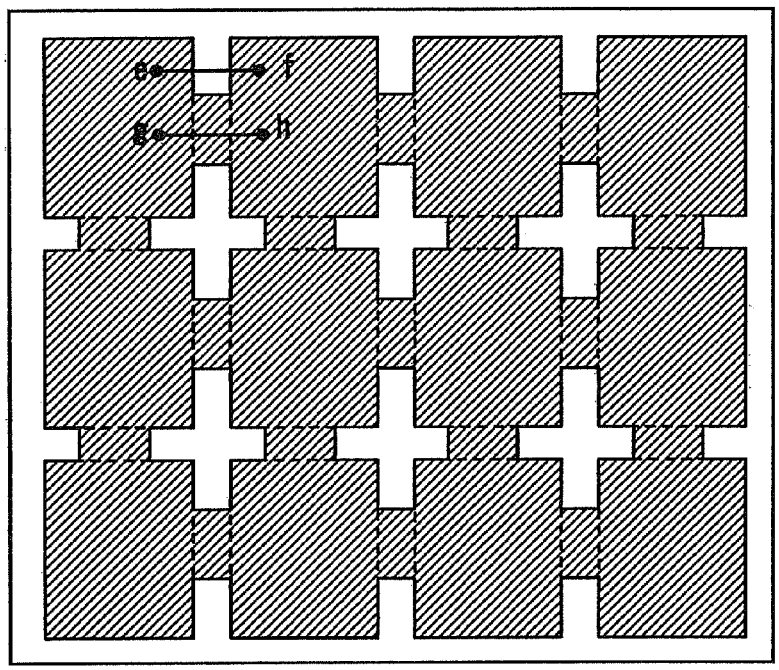
FIGS. 10A to 10C show a step of manufacturing a thin film integrated circuit.
Figure 10B:
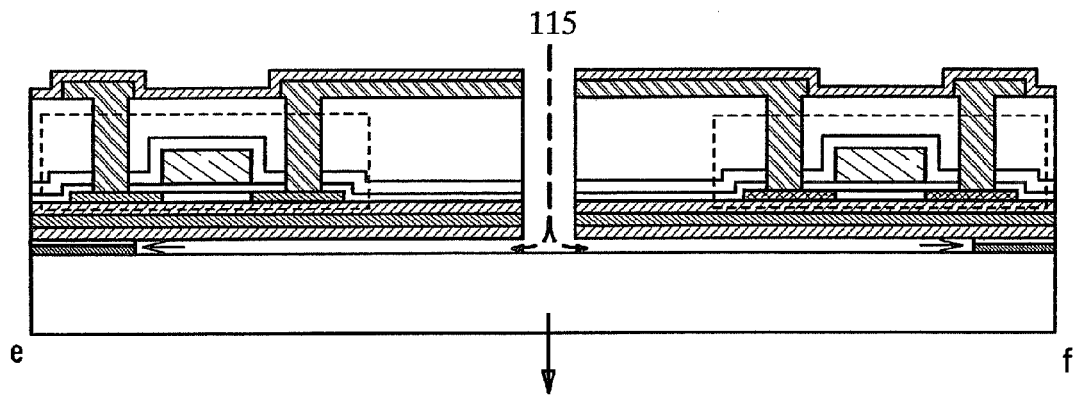
Figure 10C:
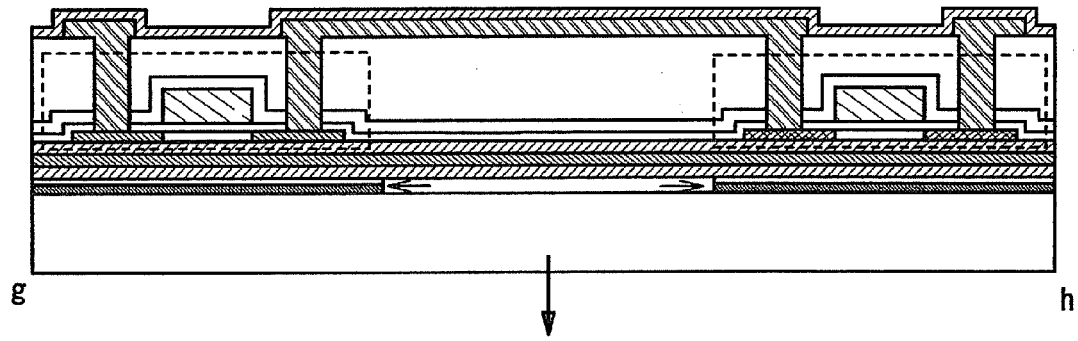

Subsequently, the metal film 102 and the reactant 50 as a separation layer are removed by introducing an etchant as shown in FIGS. 10A to 10C. FIG. 10A is a top view showing the state of removing the separation layer by introducing a gas or liquid containing halogen fluoride, FIG. 10B is a cross-sectional view of full line e-f from FIG. 10A, and FIG. 10C is a cross-sectional view of full line g-h from FIG. 10A, which crosses the connection region 106.

As shown in FIG. 10B, a gas or liquid containing halogen fluoride is introduced into the groove 105. In this embodiment, $ClF_3$ (chlorine trifluoride) is used as halogen fluoride as in Embodiment 1.

When a processing temperature is in the range of 100° C. to 300° C., a reaction rate can be increased. Consequently, the consumption of a $ClF_3$ gas can be reduced and processing time can be shortened.

The separation layer gradually recedes by introducing the etchant. Then, the insulating substrate can be removed as indicated by the arrow.

An etchant, a gas flow rate, temperature, and the like are set so that each layer of the TFT is not etched. $ClF_3$ used in this embodiment selectively removes the separation layer, while each layer of the TFT is hard to be etched by $ClF_3$ due to the base film and a protective film which are provided above and below the TFT layer and edge portions of the interlayer insulating film, the gate insulating film, the wiring, and the like which are exposed on the side face.

Even when the insulating substrate is removed, the IDF chips are connected with each other by the connection region. Therefore, the IDF chips are not separated from each other.

Thereafter, the IDF chips are cut by a dicing, scribing, or laser cutting method. Then, the IDF chip may be mounted on an article.

Figure 11A:
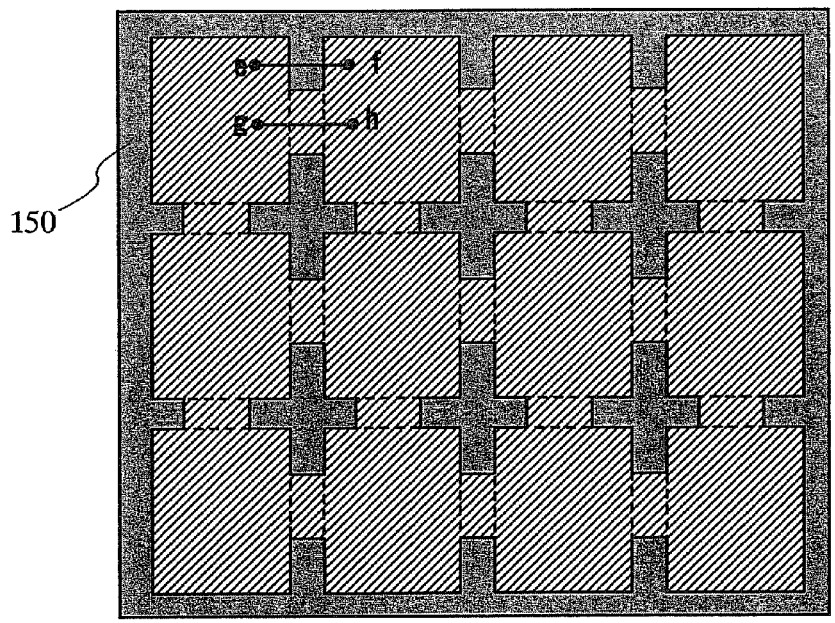
FIGS. 11A to 11C show a step of manufacturing a thin film integrated circuit.
Figure 11B:
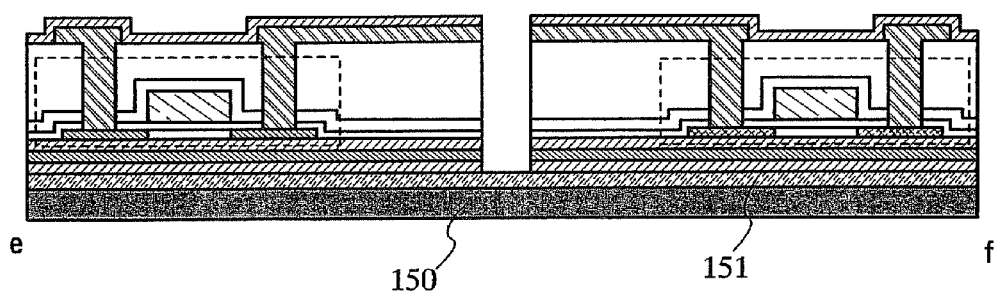
Figure 11C:
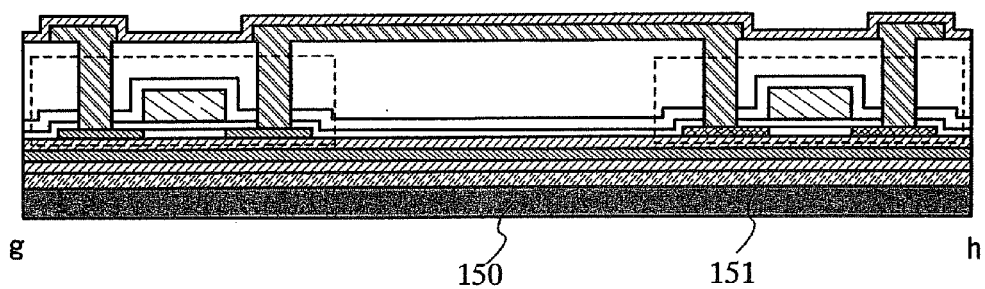

Although the IDF chip can be completed according to the above-described step, a flexible substrate may be attached thereto, as shown in FIGS. 11A to 11C. FIG. 11A is a top view showing the state of attaching a flexible substrate 150 with an adhesive 151, FIG. 11B is a cross-sectional view of full line e-f from FIG. 11A, and FIG. 11C is a cross-sectional view of full line g-h from FIG. 11A, which crosses the connection region 106.

A substrate made from a synthetic resin such as plastic as described above or acrylic can be used as the flexible substrate. In this embodiment, a substrate made from plastic is used. A thermosetting resin, an ultraviolet curing resin, an epoxy resin, a resin additive, two-sided tape, or the like can be used as the adhesive for attaching the flexible substrate. The breaking strength of the IDF chip can be increased by transferring the IDF chip to the flexible substrate.

Figure 12A:
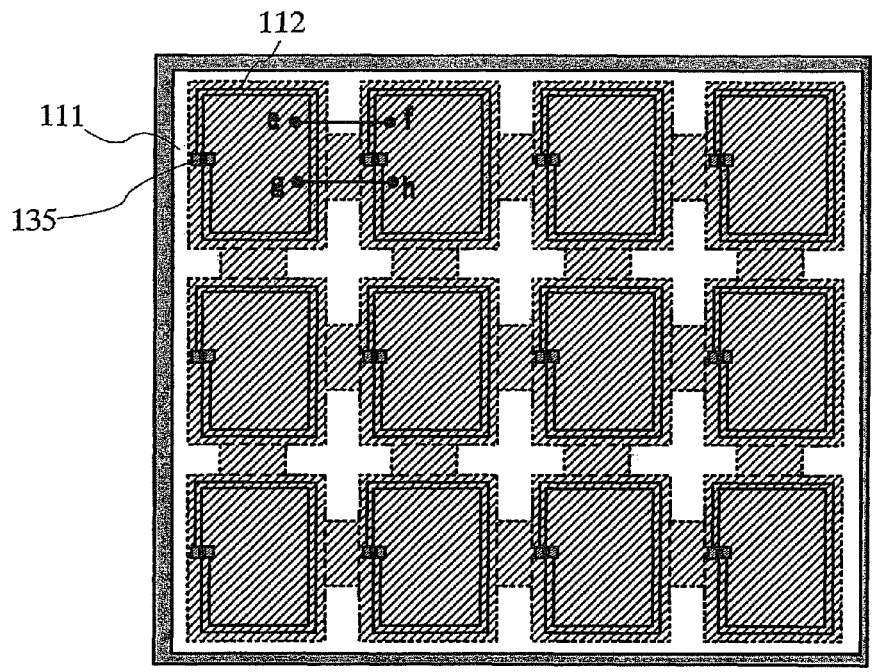
FIGS. 12A to 12C show a step of manufacturing a thin film integrated circuit.
Figure 12B:
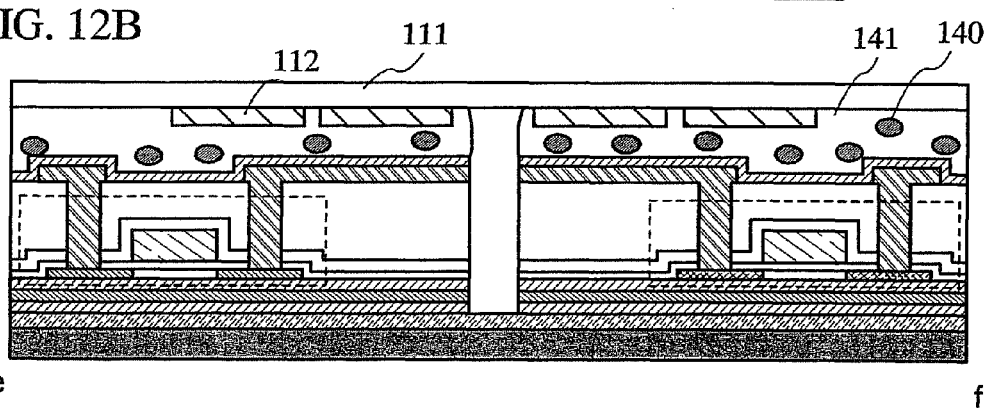
Figure 12C:
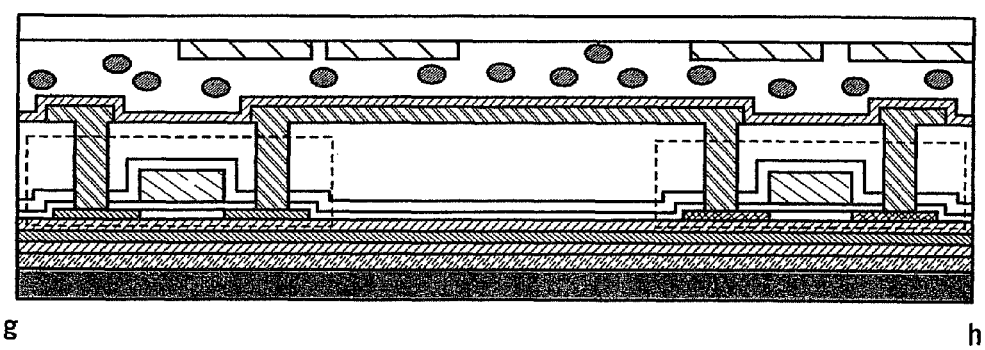

Subsequently, an antenna substrate is attached as shown in FIGS. 12A to 12C. FIG. 12A is a top view with an antenna substrate 111 attached, FIG. 12B is a cross-sectional view of full line e-f from FIG. 12A, and FIG. 12C is a cross-sectional view of full line g-h from FIG. 12B, which crosses the connection region 106.

The antenna substrate 111 is provided with an antenna 112 in a position corresponding to the IDF chip as in Embodiment 1. Embodiment 1 may be referred for a detailed manufacturing step of an antenna. In this embodiment, the insulating substrate 100 is separated; therefore, an opening may not be formed in the antenna substrate.

At this time, the IDF chip 104 and the antenna 112 are attached to each other with an anisotropic conductor 141. Instead of using the anisotropic conductor, the IDF chip and the antenna may be attached using an ultrasonic adhesive, an ultraviolet curing resin, two-sided tape, or the like.

In this embodiment, the IDF chip is mounted using an anisotropic conductor in a "face-down" manner, where the connection terminal of the IDF chip faces the antenna, as described above; however, the IDF chip may be mounted in a "face-up" manner, where the connection terminal faces in the opposite direction to the antenna, as in Embodiment 1.

Figure 13A:
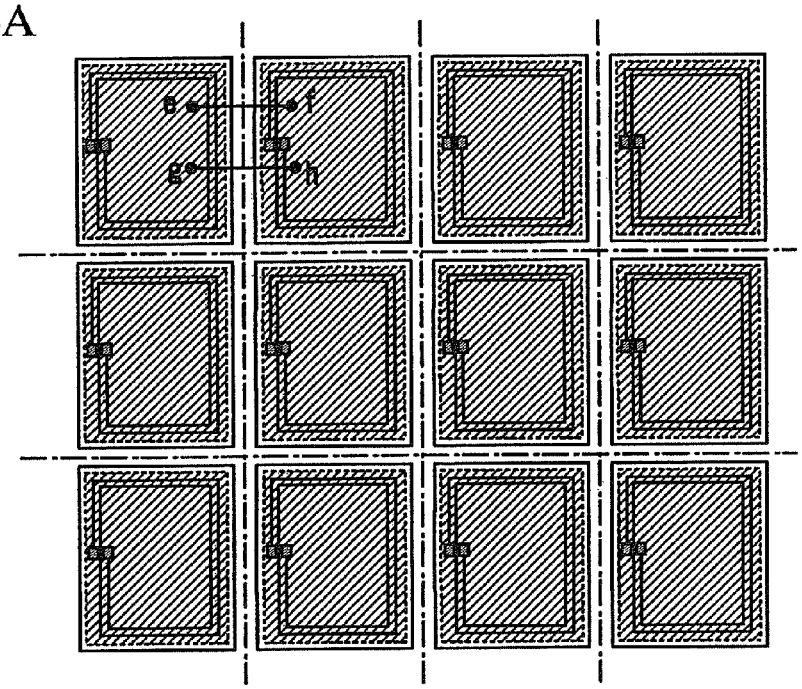
FIGS. 13A to 13C show a step of manufacturing a thin film integrated circuit.
Figure 13B:
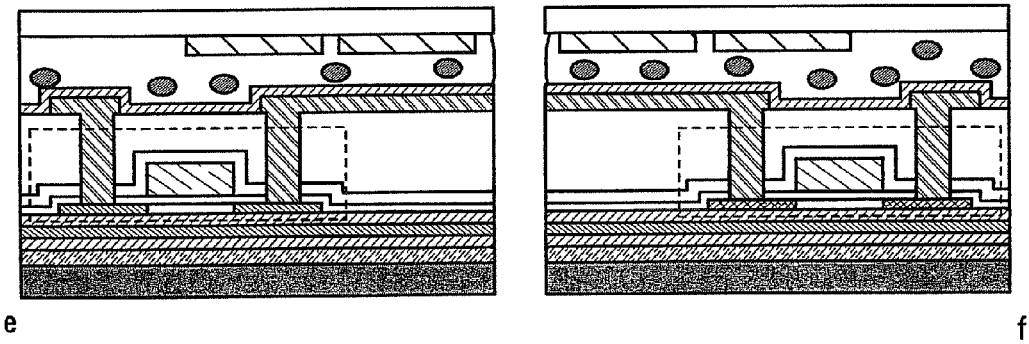
Figure 13C:
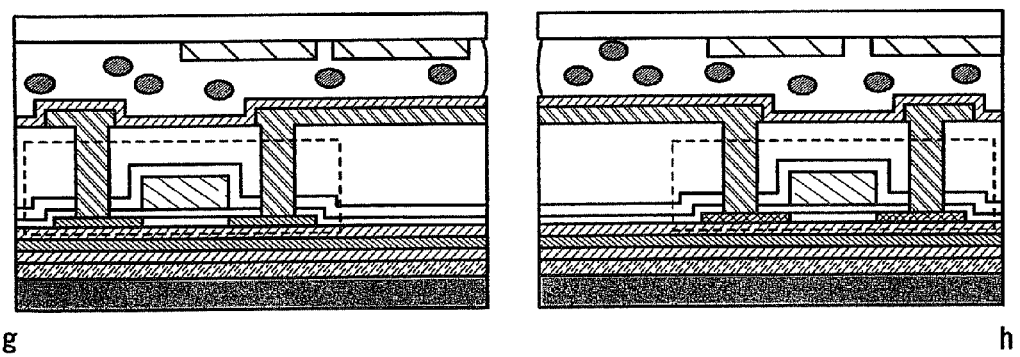

Thereafter, the IDF chips are cut by a dicing, scribing, or laser cutting method as shown in FIGS. 13A to 13C, thereby completing the IDF chip formed over the flexible substrate. FIG. 13A is a top view showing a state of the cut IDF chip, FIG. 13B is a cross-sectional view of full line e-f from FIG. 13A, and FIG. 13C is a cross-sectional view of full line g-h from FIG. 13A, which crosses the connection region 106.

Such an IDF chip may be mounted on an article. A thermosetting resin, an ultraviolet curing resin, an epoxy resin, a resin additive, two-sided tape, or the like can be used as an adhesive for mounting.

Although not shown, the IDF chip may be covered with a resin or an insulating film containing nitrogen for protection. In particular, the side face of the IDF chip is preferably covered with a resin. The resin or the insulating film containing nitrogen can be made of the same material as that of an article to be mounted with the IDF chip.

Hereinabove described is the mode in which a thin film transistor is formed over the insulating substrate, the insulating substrate is then separated, and preferably, the thin film transistor is further transferred to a flexible substrate. However, the timing or the number of separations is not limited to this embodiment. In addition, a position to which the thin film transistor is transferred is not limited to the flexible substrate, and it may be a mount article. The mounting of the IDF chip in a "face-up" manner or a "face-down" manner is determined in accordance with the number of transfers.

The case of attaching the antenna to the IDF chip is described in this embodiment; however, the antenna may be directly formed over the IDF chip. For example, the antenna can be formed in the same layer as the wiring 130.

The contactless IDF chip is described in this embodiment; however, it may be either a contact IDF chip or a hybrid DF chip.

The IDF chip and the antenna substrate are described as thick in this embodiment to make the embodiment easy to understand. However, they are actually formed very thinly.

Embodiment 3

The case of using a thin film transistor having a different shape from the above embodiment is described in this embodiment.

Figure 25A:
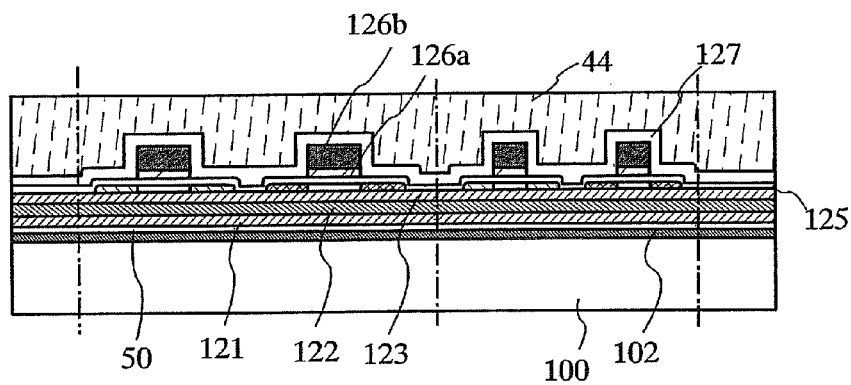
FIGS. 25A to 25D show a step of manufacturing a thin film integrated circuit.

FIG. 25A shows the embodiment as described above up to gate electrode formation. Note that the gate electrode has a laminated structure of TaN (tantalum nitride) 126a and W (tungsten) 126b in this embodiment. Silicon can also be used for another gate electrode. Subsequently, an interlayer insulating film 127 is formed to cover the gate electrode. In this embodiment, a $SiO_2$ film is formed to have a thickness of 100 nm by a plasma CVD method.

Figure 25B:
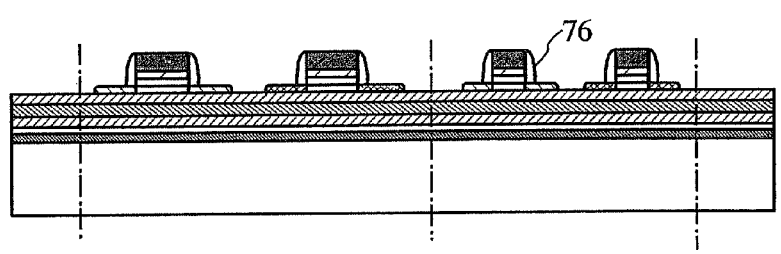

Subsequently, the entire surface is covered with a resist 44. The resist 44, the interlayer insulating film 127, and the gate insulating film 125 are etched and removed by an etchback method. Accordingly, a side wall 76 can be formed in a self-aligned manner as shown in FIG. 25B. A mixed gas of $CHF_3$ and He is used as an etching gas.

When an insulating film is formed on the back of the substrate while forming the interlayer insulating film 127, the insulating film on the back is preferably etched and removed (back treatment) using the resist 44 as a mask.

Figure 26A:
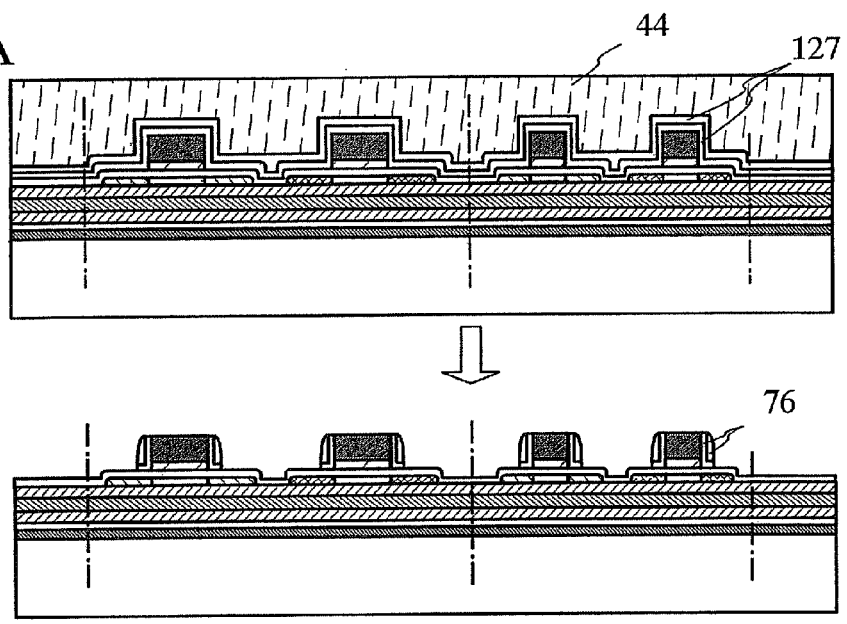
FIGS. 26A and 26B show a step of manufacturing a thin film integrated circuit.

Note that a method for forming the side wall 76 is not limited to the above. For example, methods shown in FIGS. 26A and 26B can be used. FIG. 26A shows an example in which the insulating film 127 has a laminated structure of two or more layers. The insulating film 127 has a two-layer structure of a SiON (silicon oxynitride) film of 100 nm in thickness and an LTO (Low Temperature Oxide) film of 200 nm in thickness. In this embodiment, the SiON film is formed by a plasma CVD method and a $SiO_2$ film as the LTO film is formed by a low pressure CVD method. Thereafter, L-shaped and arc-shaped side walls 76 can be formed by performing etchback using the resist 44 as a mask.

Figure 26B:
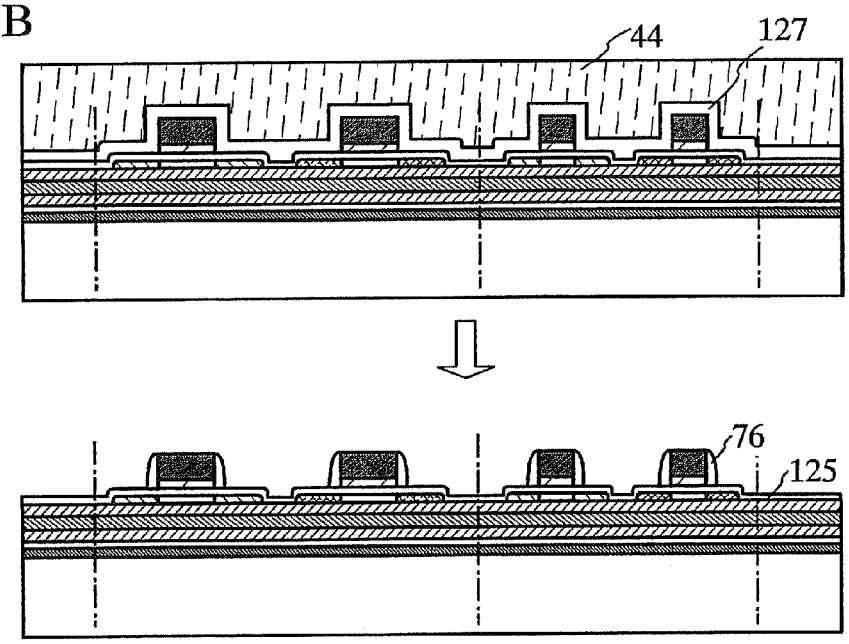

FIG. 26B shows an example in which etching is performed to leave the gate insulating film 125 unremoved at the time of etchback. The insulating film 127 in this case may have either a single layer structure or a laminated structure.

The side wall functions as a mask when forming a low concentration impurity region or an undoped off-set region in the lower part of the side wall 76 by doping high concentration of n-type impurities. In either method of forming the side wall described above, etchback conditions can be set in accordance with the width of a low concentration impurity region or an off-set region to be formed.

Figure 25C:
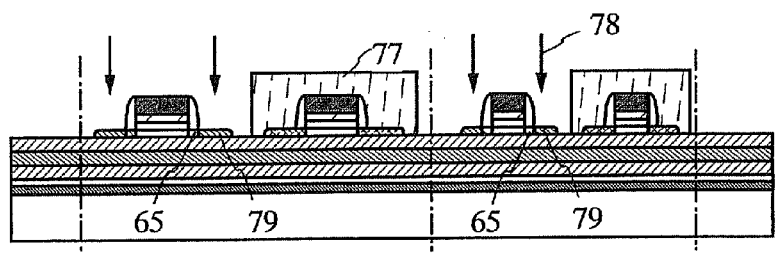

Subsequently, as shown in FIG. 25C, a resist 77 is newly formed to cover a p-type TFT region, and an impurity element 78 which imparts n-type conductivity (typically, P or As) is added in high concentration using the gate electrode 126 and the side wall 76 as a mask. The doping step is performed with dosages of $1 \times 10^{13}/cm^2$ to $5 \times 10^{15}/cm^2$ and acceleration voltages of 60 keV to 100 keV. According to the doping step, doping (so-called through doping) is performed through the gate insulating film 125, thereby forming a pair of n-type high concentration impurity regions 79. At this time, an off-set region 65 is formed below the side wall.

Note that the impurity regions may be thermally activated after removing the resist 77 by ashing or the like. For example, a SiON film may be formed to have a thickness of 50 nm and then heat-treated in a nitrogen atmosphere at a temperature of 550° C. for four hours. Further, when a SiNx film containing hydrogen is formed to have a thickness of 100 nm and heat-treated in a nitrogen atmosphere at a temperature of 410° C. for one hour, defects of the crystalline semiconductor film can be improved. This step is referred to as a hydrogenation step by which dangling bonds in, for example, the crystalline semiconductor film can be terminated. In addition, a SiON film may be formed to have a thickness of 600 nm as a cap insulating film for protecting the TFTs. Note that the hydrogenation step may be performed after the formation of the SiON film. In that case, the SiNx film and the SiON film can be sequentially formed. Thus, a three-layer insulating film of SiON, SiNx, and SiON is formed over the TFTs; however, a structure and a material thereof are not limited thereto. These insulating films are preferably formed since they have the function of protecting the TFTs. However, the films need not necessarily be formed.

Figure 25D:
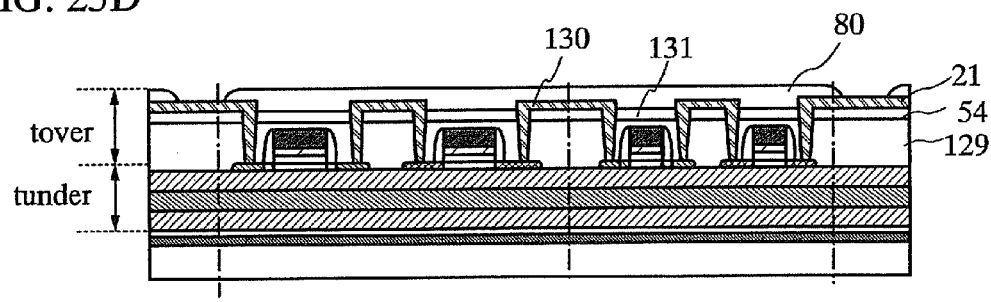

Subsequently, an interlayer insulating film 129 is formed over the TFTs as shown in FIG. 25D. The above embodiment can be referred for a material or a manufacturing method of the interlayer insulating film.

The interlayer insulating film 129 may have a laminated structure. In other words, an insulating film 54 may be laminated over the interlayer insulating film. The insulating film 54 can be formed of a film containing carbon such as DLC (Diamond Like Carbon) or carbon nitride (CN). Alternatively, the insulating film 54 can be formed of a silicon oxide film, a silicon nitride film, a silicon nitride oxide film, or the like. A plasma CVD method, a sputtering method, or the like can be used as a method for manufacturing the insulating film 54.

A filler may be mixed into the interlayer insulating film in order to prevent the TFT layer from film separation or cracking due to stress caused by the difference in thermal expansion coefficient between the interlayer insulating film and a conductive material or the like of a wiring to be formed later. This is because the filler can control thermal expansion.

Then, after forming a resist, a contact hole is formed by etching. After that, a wiring 130 for connecting the TFTs and a connecting wiring 21 for connecting the TFT to an external antenna are formed. Although a mixed gas of $CHF_3$ and He is used as an etching gas to form the contact hole, the etching gas is not limited thereto. The wiring 130 and the connecting wiring 21 may be simultaneously formed using the same material, or may be separately formed. In this embodiment, the wiring 130 connected to the TFTs is to have a five-layer structure in which Ti, TiN, Al-Si, Ti, and TiN are sequentially laminated, and is formed by a sputtering method. Then, it can be patterned to be the wiring 130.

When Si is mixed into the Al layer, the occurrence of hillocks can be prevented while resist baking during wiring patterning. Instead of Si, Cu of approximately 0.5% may be mixed as well. The occurrence of hillocks can be further suppressed by sandwiching the Al—Si layer between Ti and TiN. Note that it is desirable to use a mask formed from an inorganic material such as SiON in patterning. A material and a forming method of the wiring are not limited thereto. The above-described material which is used for the gate electrode may be employed. At this time, a protective film 80 may be provided over the wiring, and an opening may be formed in the connection region.

Through the above-described steps, the IDF chip with TFTs is completed. A top gate structure is described in this embodiment; however, a bottom gate (inversely staggered) structure may be adopted as well.

As shown in FIG. 25D, it is desirable to adjust the thickness of the base film and the interlayer insulating film in the IDF chip so that a distance from the semiconductor layer to the bottom of the base film ($t_{under}$) may be equal to or approximately equal to a distance from the semiconductor layer to the top of the interlayer insulating film ($t_{over}$). Stress on the semiconductor layer can be relieved and occurrence of cracks can be prevented by placing the semiconductor layer at the center of the IDF chip in this manner.

Thereafter, a groove can be formed to separate the insulating substrate, and an antenna can be formed as in the above embodiment.

The thin film transistor having a side wall, which is described in this embodiment, can be freely combined with the above embodiment modes and the above embodiments.

Embodiment 4

A method for manufacturing a thin film integrated circuit, which is different from the modes described in Embodiments 1 and 2, is described in this embodiment.

Figure 14A:
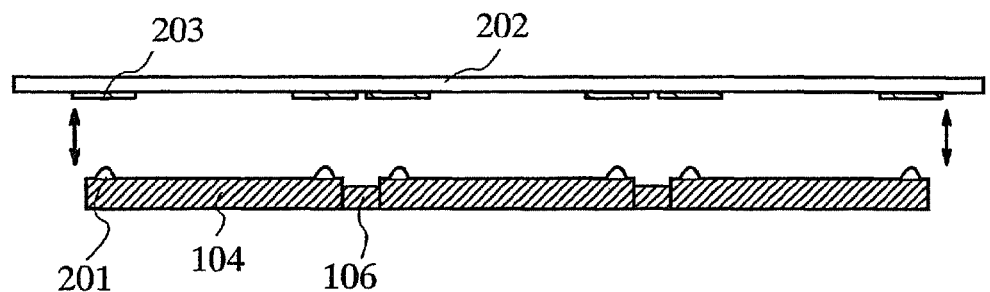
FIGS. 14A to 14E show a step of manufacturing a thin film integrated circuit.

As shown in FIG. 14A, IDF chips connected by a connection region 106 is prepared according to Embodiment Mode 2 or Embodiment 2. The IDF chips are provided with bumps 201 which are formed from the same material as a wiring 130.

In addition, a second substrate 202 provided with wirings 203 is prepared. As the second substrate, a glass substrate such as a bariumborosilicate glass substrate or an aluminoborosilicate glass substrate; a quartz substrate; or the like can be used. A substrate made of a synthetic resin such as plastic typified by polyethyleneterephthalate (PET), polyethylenenaphthalate (PEN), or polyetersulfone (PES) or acrylic can be used as another substrate having an insulating surface. Such a synthetic resin can be flexible.

Figure 14B:

As shown in FIG. 14B, with the use of an adhesive 204, the connected IDF chips are attached to the second substrate 202 provided with the wirings 203. At this time, the IDF chips are attached to the second substrate so that the bumps 201 are connected to the wirings 203. An anisotropic conductor can be used as the adhesive 204. Instead of an anisotropic conductor, the IDF chips may be attached using an ultrasonic adhesive, an ultraviolet curing resin, two-sided tape, or the like.

Figure 14C:
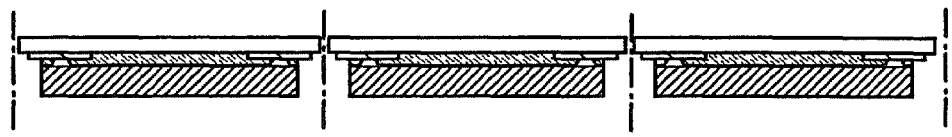

As shown in FIG. 14C, the IDF chips are cut by a dicing, scribing, or laser cutting method.

Figure 14D:

Thereafter, an antenna terminal 205 is formed as shown in FIG. 14D. The antenna terminal can be formed by a droplet discharge method, a sputtering method, a CVD method, or the like.

Figure 14E:
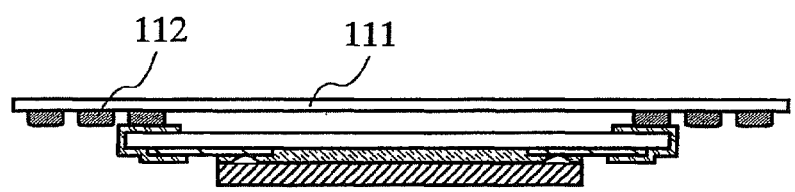

Then, an antenna substrate 111, provided with an antenna 112, is attached to the IDF chip, as shown in FIG. 14E. The above embodiment mode and embodiment can be referred for a material or a manufacturing method of the antenna or the antenna substrate. The antenna substrate may be made from a material of an article to be mounted with the IDF chip.

As described above, the IDF chip can take various mounting forms of antennas. The IDF chip of this embodiment goes through manufacturing process in a connected state, and has no particular limitation on the mounting form or the mounting method of an antenna.

The contactless IDF chip is described in this embodiment; however, it may be either a contact IDF chip or a hybrid IDF chip as described in Embodiment 1 or 2.

The IDF chip and the antenna substrate are described as thick in this embodiment to make the embodiment easy to understand. However, they are actually formed very thinly.

Embodiment 5

Various forms of IDF chips are described in this embodiment.

Figure 22A:
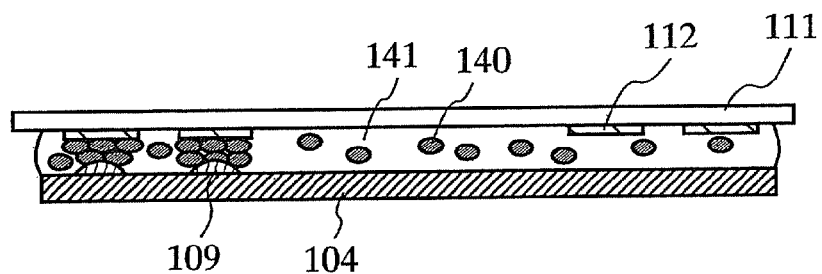
FIGS. 22A to 22C show a mode of a thin film integrated circuit.

As shown in FIG. 22A, an IDF chip 104 and an antenna 112 which is formed over an antenna substrate 111 are connected to each other with a connection terminal, for example, a bump 109 therebetween, by using an anisotropic conductor 141 with a conductor 140. Instead of an anisotropic conductor, an ultrasonic adhesive, an ultraviolet curing resin, two-sided tape, or the like may be used.

Figure 22B:
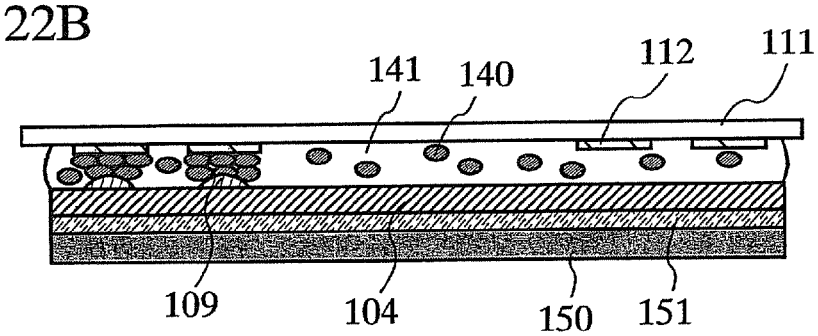
Figure 22C:
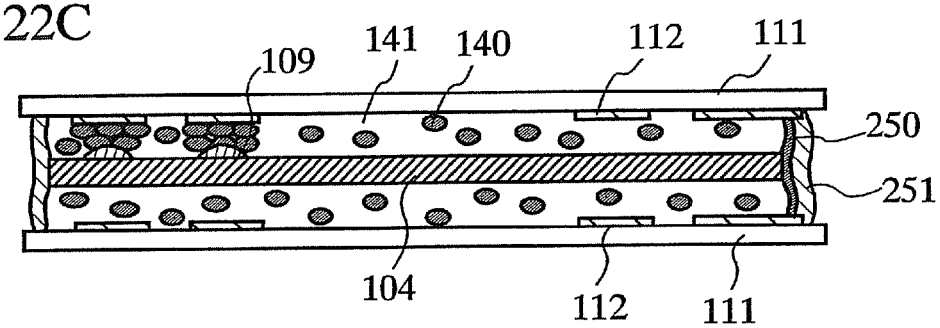

As shown in FIG. 22B, an IDF chip is attached to a flexible substrate 150 by an adhesive 151. A thermosetting resin, an ultraviolet curing resin, an epoxy resin, a resin additive, two-sided tape, or the like can be used as the adhesive.

A plurality of antenna substrates may be provided. For example, antenna substrates provided with antennas 112 are provided on both sides of the IDF chip. Accordingly, total antenna length can be extended, which can increase a communication distance. At this time, a conductive film 250 is formed to connect the antenna on one side to the antenna on the other side. For example, droplets having conductors are selectively discharged between the antenna substrates by a droplet discharge method to form the conductive film 250. Thereafter, the conductive film 250 is preferably covered with an insulating film 251 to protect the conductive film 250.

In addition, a structure for connecting the antenna on one side to the antenna on the other side is not limited to this embodiment. For example, the antenna on one side and the antenna on the other side may each be connected to the IDF chip through the bump 109.

As described above, the IDF chip mounted with the antenna can be completed. Note that the method for mounting the antenna on the IDF chip of the invention is not limited to the forms described in this embodiment. For example, there are modes of forming the antenna in the same layer as the conductive film included in the thin film transistor and forming the antenna, without using the antenna substrate, over the IDF chip.

Note that the IDF chip of the invention is not particularly limited to the mode of the IDF chip described in this embodiment. In other words, although the contactless IDF chip is described in this embodiment, it may be either a contact IDF chip or a hybrid IDF chip.

Embodiment 6

Forms of articles mounted with IDF chips are described in this embodiment. Note that the mounting position of the IDF chip, the shape of an article to be mounted with the IDF chip, and the number of IDF chips to be mounted are not limited to those in this embodiment.

Figure 15A:
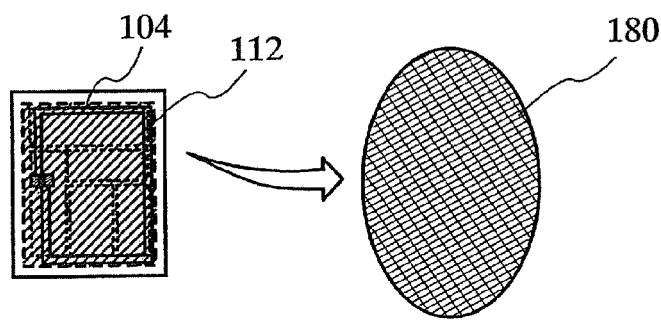
FIGS. 15A and 15B show an article mounted with a thin film integrated circuit.
Figure 15B:
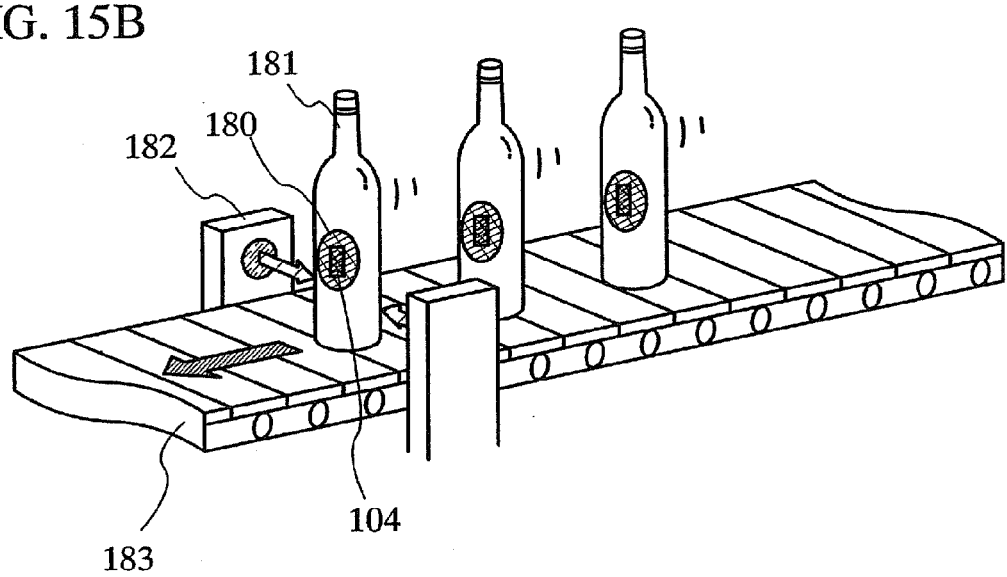

FIGS. 15A and 15B show the case of attaching the IDF chip to a label of food or drink and mounting the IDF chip on a container of the food or drink, for example, a beer bottle 181.

As shown in FIG. 15A, an IDF chip 104 provided with an antenna 112 is attached to a label 180 by two-sided tape or the like. When the label itself has adhesiveness, the IDF chip may be directly attached to the adhesive label.

Such goods pass by a reader/writer 182 on a conveyor belt 183 or the like as shown in FIG. 15B; accordingly, information can be inputted or read. Existing information can be rewritten depending on the kind of a memory formed in the IDF chip.

Since information can be inputted to or read out of the IDF chip provided with the antenna without contact, information can be managed by a reader/writer with goods packed in a cardboard box or the like.

Such goods mounted with the IDF chips can largely reduce personnel cost in distribution. Furthermore, human error can also be reduced.

Information in the IDF chip mounted on goods as described above ranges from basic information relating to production or manufacture such as place, processor/manufacturer, date, and the like, to allergy information, main component, advertisement, and the like. In addition, an information storage means such as a bar code or a magnetic tape may be used to increase the amount of information or to improve security. In the case of using the IDF chip in combination with, for example, a bar code, they are preferably appropriately used in accordance with the purpose. For example, information unnecessary to rewrite, such as the basic information, may be inputted to a bar code, and rewritable information may be inputted to an IDF chip.

When a ROM or the like, to which data cannot be rewritten, is formed in a memory included in an ID chip, it is possible to prevent forgery of securities such as banknotes and checks, and certificates such as a family register, a resident card, a name card, a traveler's check, and a passport.

Figure 27:
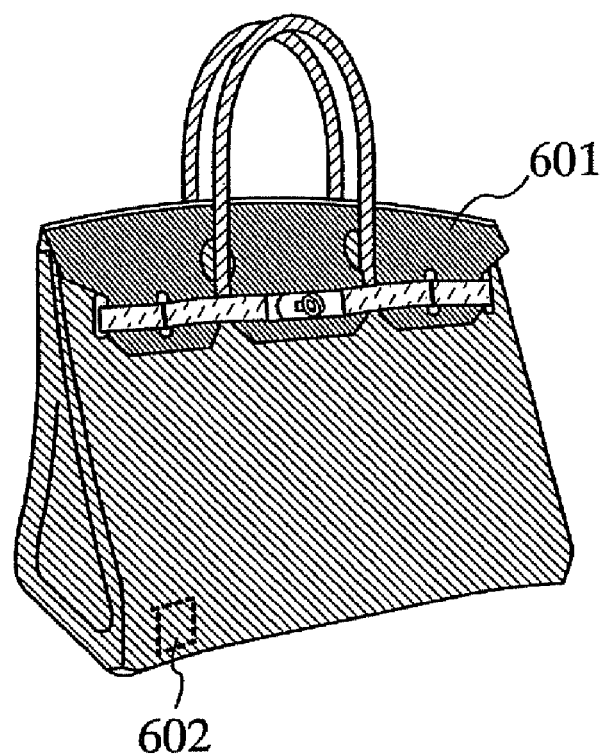
FIG. 27 shows an article mounted with a thin film integrated circuit.

The case of mounting an IDF chip 602 on a bag 601 is described as an example of anti-theft measures. For example, the IDF chip can be mounted on the bottom or the side of the bag as shown in FIG. 27. Since the IDF chip is extremely thin and small, it can be mounted while maintaining the attractive design of the bag. In addition, the IDF chip transmits light; thus, it cannot be easily recognized by a thief. Accordingly, there is no fear that the ID chip is removed by a thief.

In the case where such a bag mounted with an IDF chip is stolen, information on the actual location of the bag can be obtained by using, for example, a GPS (Global Positioning System). Note that the GPS is a system for determining the position based on the time difference found by receiving a signal transmitted from a GPS satellite.

In addition to the stolen article, information on the actual location of lost property or thing left behind can be obtained by using the GPS.

In addition, the IDF chip can be mounted on a vehicle such as an automobile or a bicycle, a watch, accessories, and the like as well as the bag.

Figure 16A:
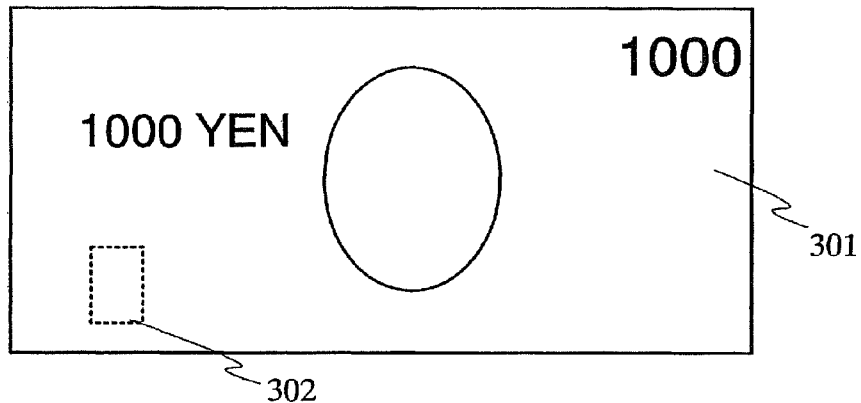
FIGS. 16A to 16C show an article mounted with a thin film integrated circuit.

FIG. 16A shows a banknote 301 mounted with an IDF chip. In FIG. 16A, an IDF chip 302 is fixed inside the banknote, but it may be formed on the surface. This is because the IDF chip transmits light and does not disturb printing or the like even when formed on the surface.

In addition, the IDF chip may be mounted on securities other than a banknote. For example, it may be mounted on a coin. Mounting the IDF chip on a banknote or a coin can be helpful in preventing forgery as well as improve accuracy of identification of the banknote or the coin in a vending machine or the like.

Figure 16B:
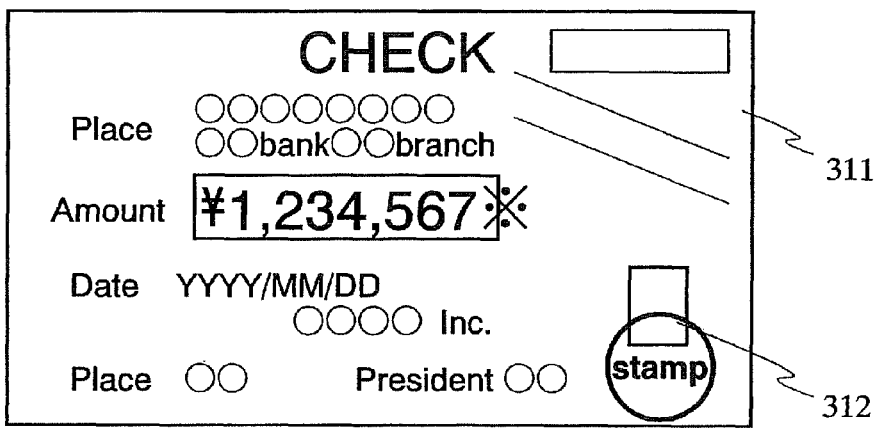

FIG. 16B shows a check 311 mounted with an IDF chip. In FIG. 16B, an IDF chip 312 is provided on the surface of the check. Since the IDF chip transmits light, it may be provided on the surface of the check. Naturally, the IDF chip may also be fixed inside the check.

Figure 16C:
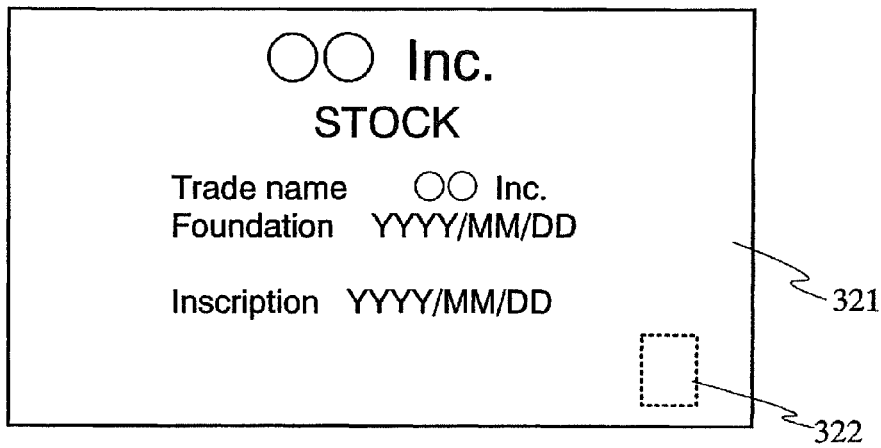

FIG. 16C shows a stock certificate 321 mounted with an IDF chip. Although an IDF chip 322 is fixed inside the stock certificate in FIG. 16C, it may also be provided on the surface thereof. The size, the shape, and the mounting position of the IDF chip are not exclusively limited. However, the IDF chip may be made larger in the case of including a large amount of information. Even in such a case, the IDF chip transmits light; therefore, it does not disturb printing wherever it is mounted.

A banknote, a check, a stock certificate, or the like may. be printed by using ink including the IDF chip. Further, a plurality of IDF chips may be scattered when mixing a material of a banknote, a check, a stock certificate, or the like with chemicals to form a banknote, a check, a stock certificate, or the like mounted with the plurality of IDF chips. Since the IDF chip can be manufactured at a low cost, a plurality of IDF chips can be mounted on the banknote, the check, the stock certificate, or the like without adversely affecting the manufacturing cost thereof.

As described above, the IDF chip is formed of a thin film integrated circuit that is drastically reduced in thickness; thus, the IDF chip can be mounted on a very thin paper-like article. Therefore, the attractive design of an article can be maintained. In addition, since the IDF chip transmits light, it may be mounted on the surface of an article.

FIG. 7A shows a book 331 mounted with an IDF chip. An IDF chip 332 can be provided on the surface of or inside a cover of the book. Alternatively, the IDF chip may be mounted on any page of the book.

Figure 17A:
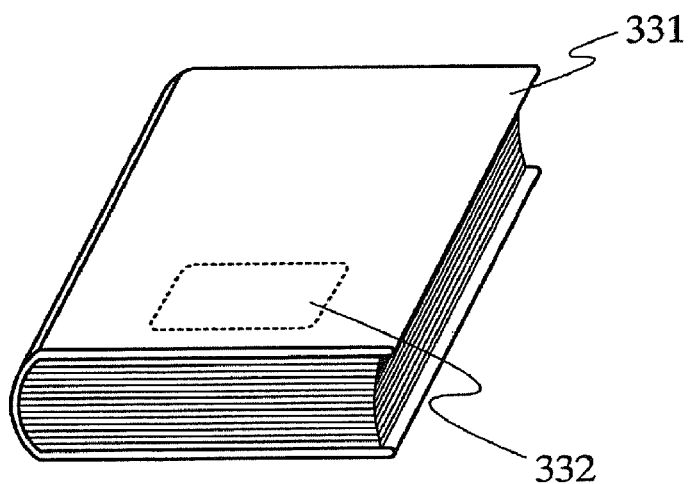
FIGS. 17A and 17B show an article mounted with a thin film integrated circuit.
Figure 17B:
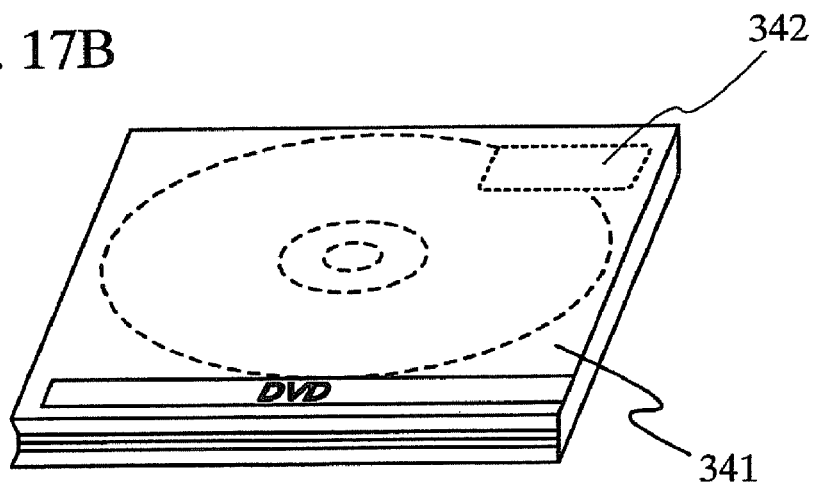

FIG. 17B shows a DVD 341 mounted with an IDF chip. An IDF chip 342 can be provided on the surface of or inside the packaging of the DVD. Naturally, the IDF chip may be mounted on a product such as a CD or a videotape as well as a DVD.

When the IDF chip is mounted on such an article of which rental service is actively performed, the lending and return processes can be performed more simply in a shorter time. In addition, product information such as contents, advertisement, cast, and the like can be written in the IDF chip as data.

The IDF chip can be changed in the shape, to some extent, in accordance with the shape of an object to which the IDF chip is attached. Accordingly, applications of the IDF chips are not limited to those described in this embodiment, and other various applications are possible.

By mounting the IDF chip on a personal belonging, the belonging can be located even when it is lost or stolen.

The IDF chip may be fixed to a piece of wrapping paper for wrapping a belonging. Further, a message can be written in the IDF chip as audio data. In that case, the data can be read by a reader and the message can be listened to by a reproducing device. In addition, various information can be provided through a network by reading data with a reader.

The case of mounting an IDF chip on goods such as food for safety management is described.

Figure 28:
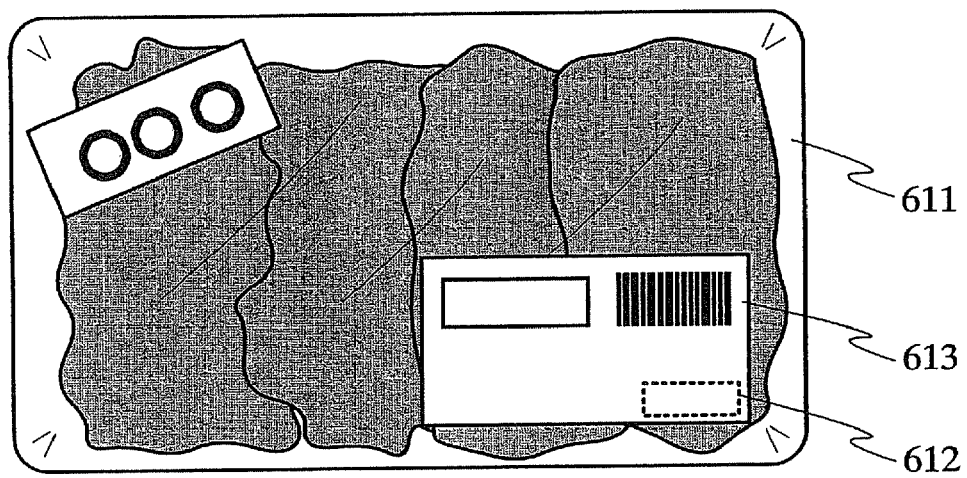
FIG. 28 shows an article mounted with a thin film integrated circuit.

FIG. 28 shows a package 611 of meat attached with a label 613 mounted with an IDF chip 612. The IDF chip may be mounted on the surface of or inside the label. In the case of fresh food such as vegetables, the IDF chip may also be mounted on a piece of cellophane for covering fresh food.

The IDF chip can store basic information relating to the product such as a production area, a producer, a processing date, and an expiration date. Further, an application such as a serving suggestion with the product may be stored. Since such basic information need not be rewritten, it may be stored in an unrewritable memory such as an MROM. Such an application may be stored in a rewritable and erasable memory such as an EEROM.

In addition, it is important to be able to know the condition of animals and plants before processing in order to manage food safety. Therefore, the IDF chip may be implanted in animals and plants and the information relating to the animals and plants in the IDF chip may be obtained by a reader. Information on animals and plants may include a breeding place, feed, a breeder, and a record of infection with communicable diseases.

When the price of a product is stored in the IDF chip, the product can be paid for more simply in a shorter time than the case of using a conventional bar code. In other words, a plurality of products mounted with the IDF chips can be paid for at one time. However, the reader needs to have an anti-collision function to manage the case of reading such a plurality of IDF chips at one time.

Further, the products can be paid for at the cash register even when there is a distance between the products and the cash register, depending on the communication distance of the IDF chip. In addition, the IDF chip is also helpful in preventing shoplifting and the like.

Moreover, the IDF chip can be used in combination with other information media such as a bar code and a magnetic tape. For example, basic information which is unnecessary to rewrite may be stored in the IDF chip, and information to be renewed, for example, information on discount price or special price may be stored in a bar code. This is because information in the bar code can be easily changed, unlike the IDF chip.

Mounting the IDF chip in this manner can increase the amount of information given to consumers; thus, consumers can purchase products with ease.

Described next are a product mounted with an IDF chip and a manufacturing apparatus (manufacturing robot) which is controlled based on the information in the IDF chip, in order to perform manufacturing control.

These days, customized products are often manufactured, and they are manufactured on a production line based on the customized information of the products to be produced. For example, in a production line of cars that provides free color choice of doors, an IDF chip is mounted on a part of each car and a painting apparatus is controlled based on the information in the IDF chip. Thus, a customized car can be manufactured. When the IDF chip is mounted, there is no need to adjust the order of and the number of cars to be put into a production line and to be painted in the same color in advance. Furthermore, it is not necessary to set a program for controlling a painting apparatus in accordance with the order and the number of cars. In other words, a manufacturing apparatus can operate individually based on information in the IDF chip mounted on each car.

As described above, the IDF chip can be applied to various fields. Based on information stored in the IDF chip, specific information for manufacturing can be obtained and a manufacturing apparatus can be controlled based on the information.

Figure 29:
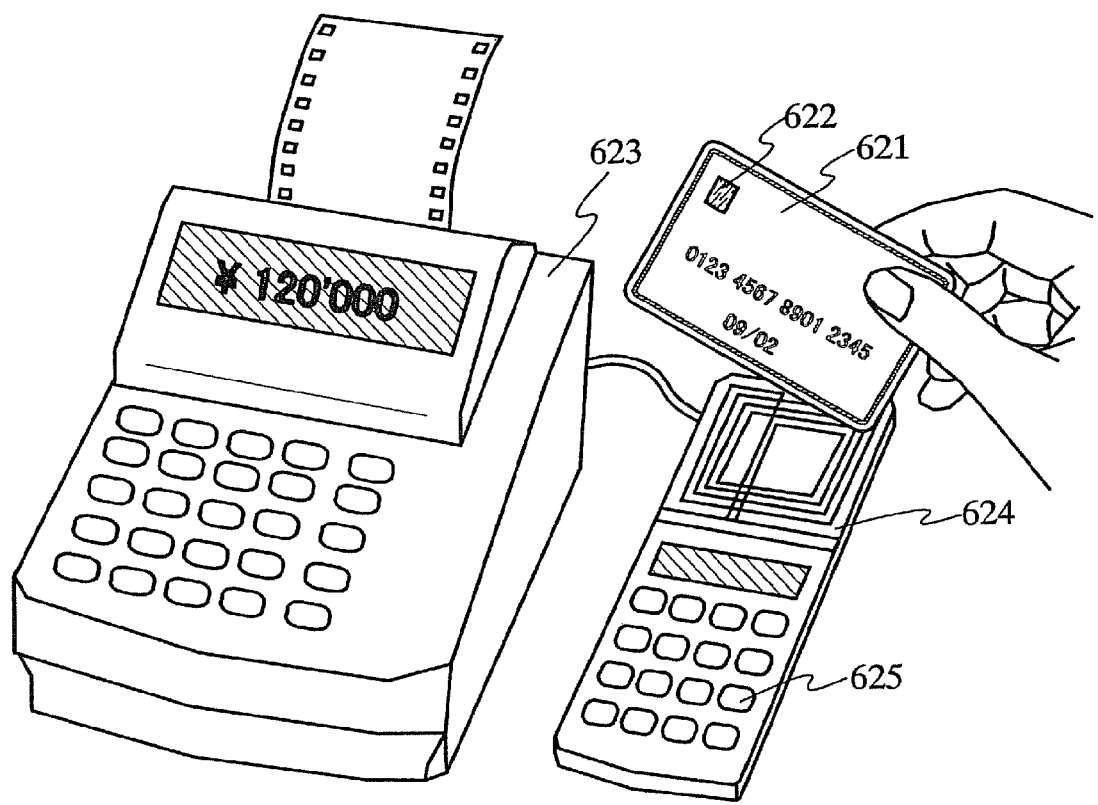
FIG. 29 shows an article mounted with a thin film integrated circuit.

Hereinafter described is a mode of using a card 621 mounted with an IDF chip 622 as electronic money. FIG. 29 shows that the card 621 is used to make a payment. FIG. 29 also shows a cash register 623 and a reader/writer 624. The IDF chip 622 stores information on the amount deposited into the card 621. The information on the amount can be read without contact by the reader/writer 624 and transferred to the cash register 623. The cash register 623 verifies that the amount deposited into the card 621 is more than the amount to be paid for, and thus payment is made. Then, the information of the remaining amount of the money after the payment is transmitted to the reader/writer 624 and is written in the IDF chip 622 of the card 621 by the reader/writer 624.

Note that the reader/writer 624 may be equipped with a key pad 625 for inputting a personal identification number and the like, thereby preventing the card 621 from being used to make payment by a third party without notice.

The IDF chip is preferably placed at the center of an article to be mounted therewith (mount article) and is preferably covered with a material of the article. Accordingly, the mechanical strength of the IDF chip can be improved. Specifically, when the thickness of the mount article is denoted by D, an interposed position of the IDF chip (center of the IDF chip) X may be set to satisfy $(½)·D–30~\mu m \leq X \leq (½)·D+30$ μm. In other words, the thickness of the mount article is D>60 μm.

Even when an antenna is separately formed, the IDF chip is preferably placed in the above position.

As described above, it is desirable to adjust the thickness of the base film and the interlayer insulating film in the IDF chip so that a distance from the semiconductor layer to the bottom of the base film ($t_{under}$) may be equal to or approximately equal to a distance from the semiconductor layer to the top of the interlayer insulating film ($t_{over}$). Thus, stress on the semiconductor layer can be relieved and the occurrence of cracks can be prevented when the IDF chip is placed at the center of the article and the semiconductor layer is placed at the center of the IDF chip.

In addition, the IDF chip and the antenna may be separately mounted on the article. There is no limitation on a mounting area and the degree of freedom for design is increased when the IDF chip and the antenna are mounted on different faces. The antenna in this case can be directly mounted on the article. Thereafter, the connection terminal of the antenna is joined to a connection terminal of the IDF chip. At this time, they can be joined to each other with an anisotropic conductor.

Embodiment 7

An IDF chip is assumed to have a measure of area in some cases and is highly flexible as compared with a chip formed with a silicon wafer; therefore, the damage in a bent state needs to be considered. Correspondingly, in this embodiment, the state where a banknote equipped with an IDF chip is bent is described.

Figure 19A:
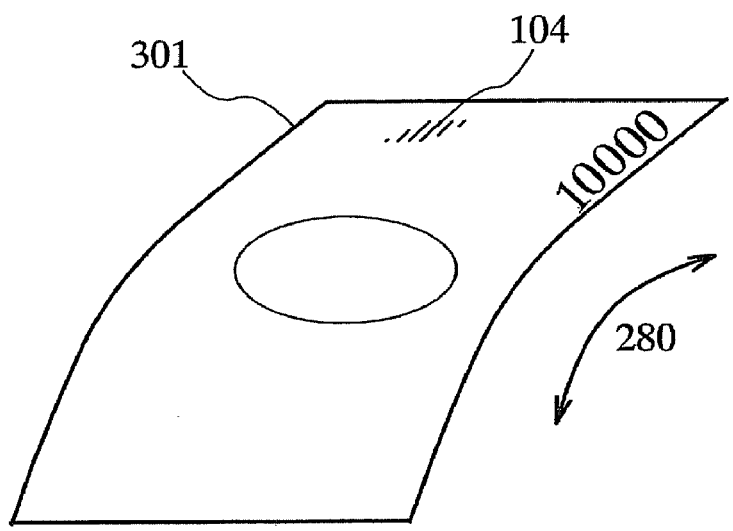
FIGS. 19A and 19B show a bent article mounted with a thin film integrated circuit.

FIG. 19A shows a banknote 301 which is an IDF chip mount article and is bent in the arrow direction 280. Generally, a thin film material easily bends or can be easily bent in the longitudinal direction; accordingly, the case of bending in the longitudinal direction is described in this embodiment.

Figure 19B:
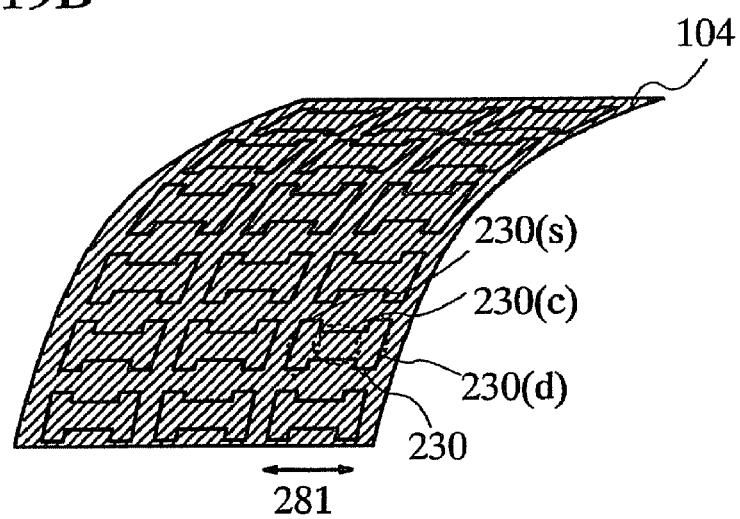

An IDF chip 104 in such a state is shown in FIG. 19B. The IDF chip has a plurality of thin film transistors 230 and the thin film transistors are arranged so that a carrier flow direction 281 is perpendicular to the arrow direction (bending direction) 280. In other words, a source region 230(*s*), a channel formation region 230(*c*), and a drain region 230(*d*) of each thin film transistor are arranged so as to be perpendicular to the bending direction 280. As a result, damage or separation of the thin film transistor due to bending stress can be prevented.

In the case of using a crystalline semiconductor film using laser irradiation as a semiconductor film, a laser scanning direction 283 is also set so as to be perpendicular to the bending direction 280. For example, as shown in FIG. 23B, in the case of moving a laser irradiation region (spot) 282 in a zigzag to crystallize the entire surface, the laser scanning direction 283 (major axis side) is set perpendicular to the bending direction 280.

By bending the IDF chip in such a direction, the IDF chip, particularly, the thin film transistor is not damaged. Further, the grain boundaries in the direction of the carrier flow can be reduced to a minimum. Consequently, the electrical characteristics of the thin film transistors, particularly, the mobility can be improved.

Further, damage or separation of the thin film transistor due to bending stress can be prevented by making a ratio of an area of the patterned semiconductor film in the IDF chip 1% to 30%.

This embodiment can be applied to a semiconductor film included in any of a contactless IDF chip, a contact IDF chip, and a hybrid IDF chip.

Embodiment 8

An application mode using an article equipped with a thin film integrated circuit is described in this embodiment.

Figure 18A:
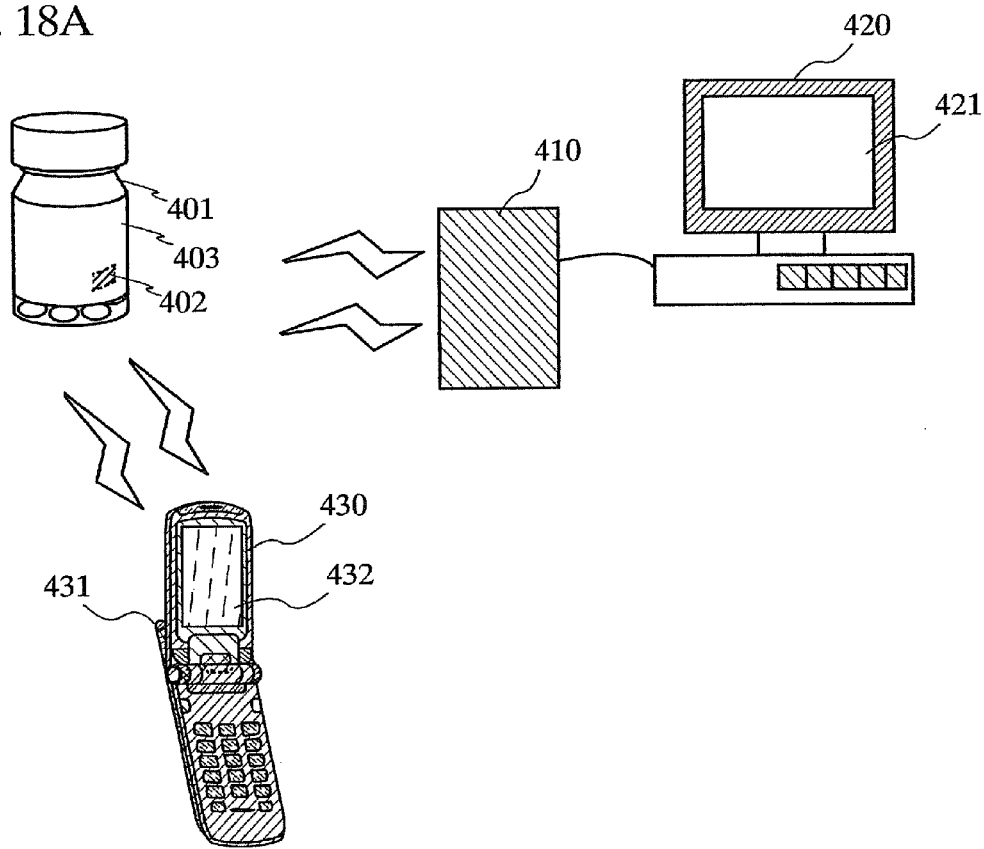
FIGS. 18A and 18B show an application of an article mounted with a thin film integrated circuit and a circuit configuration of an IDF chip and a reader/writer, respectively.

FIG. 18A shows information flow through a medicine bottle 401 equipped with an IDF chip 402 attached to a label 403, a reader/writer 410, a personal computer 420 having a display portion 421, and the like. Information in the IDF chip, for example, a dose, an effect, a side effect, allergy, and the like is inputted into the personal computer through the reader/writer, and the information can be confirmed on the display portion 421.

The IDF chip may include information such as business advertisement, for example, a home page address. In that case, an Internet browser is activated and the address is inputted through the reader/writer; then, the homepage can be seen. By reading information recorded in an IDF chip, an input error can be avoided as compared with the case where the information is inputted manually.

The information on medicine can be read with the use of a portable electronic device having a function of a reader/writer, typified by a cellular phone or a PDA For example, a coil serving as an antenna 431 of a cellular phone 430 is designed to serve also as an antenna of a reader/writer. The information recorded in the IDF chip can be confirmed on a display portion 432 of the cellular phone.

Figure 18B:
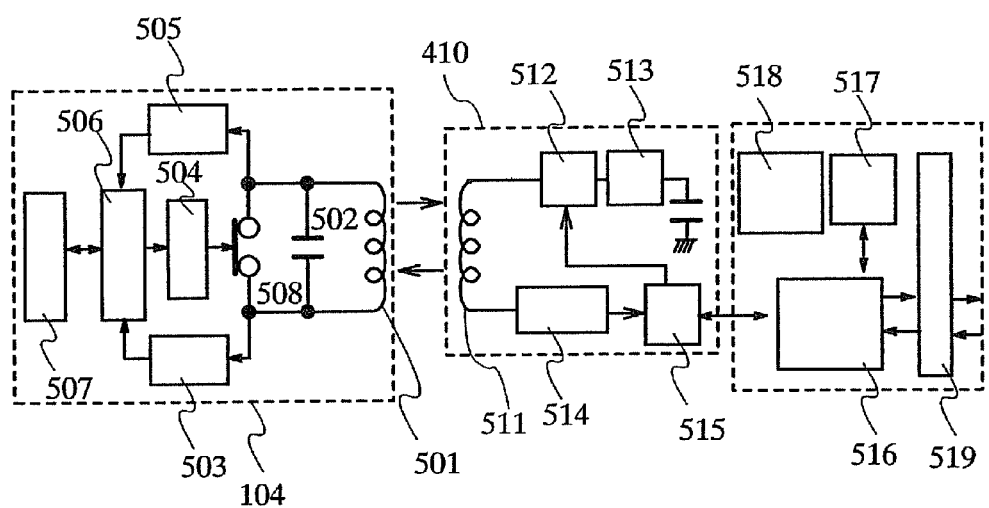

FIG. 18B shows a circuit configuration of an IDF chip and a reader/writer.

First, an IDF chip 104 includes an antenna coil 501, a capacitor element 502, a demodulation circuit 503, a modulation circuit 504, a rectifier circuit 505, a microprocessor 506, a memory 507, and a switch 508 for applying a load to the antenna coil 501. These circuits and the microprocessor can be formed with a thin film integrated circuit. The number of the memory 507 is not limited to one but a plurality of memories may be used.

A reader/writer 410 includes an antenna coil 511, a modulation circuit 512, and an oscillating means 513, which contribute to the generation of a transmit signal. The reader/writer 410 further includes a detection demodulation circuit 514 which detects, amplifies, and modulates a received signal. Since a signal received from the IDF chip is extremely weak, the received signal is preferably separated and amplified by a filter or the like. Subsequently, the received signal is transmitted to a gate ASIC (application-specific integrated circuit) 515.

The data inputted to the gate ASIC is transmitted to a microprocessor 516 and processed. As necessary, mutual transmission of a signal is performed between the microprocessor 516 and a memory 517, thereby achieving predetermined processing. A program, data, and the like which are used in the microprocessor 516 are stored in the memory 517. Moreover, the memory can be used as an operation area in processing. Thereafter, signal transmission between the microprocessor and a signal interface 519 can be performed. Further, a power source 518 for such mutual signal exchange is provided.

The microprocessor 516, the memory 517, and the signal interface 519 can be provided in a personal computer or a telephone itself.

The reader/writer may have an anti-collision function.

Further, an electronic device such as a cellular phone which also serves as a reader/writer may include an antenna coil 511, a modulation circuit 512, an oscillating means 513, a detection demodulation circuit 514, a gate ASIC 515, a microprocessor 516, a memory 517, a power source 518, and a signal interface 519.

Naturally, the circuits described above and the like can be formed in a personal computer to provide a function of a reader/writer.

A signal transmitted from the gate ASIC 515 as electric waves through the modulation circuit 512 is converted into an AC electrical signal by electromagnetic induction in the antenna coil 501. The AC electrical signal is demodulated in the demodulation circuit 503 and transmitted to the microprocessor 506. Further, power supply voltage is generated with the use of the AC electrical signal in the rectifier circuit 505, and supplied to the microprocessor 506.

In the microprocessor 506, a variety of processing is performed in accordance with inputted signals. The memory 507 can be used not only for storing a program, data and the like used in the microprocessor 506 but also as an operation area in processing. A signal transmitted from the microprocessor 506 to the modulation circuit 504 is modulated into an AC electrical signal. The switch 508 can apply a load to the antenna coil 501 in accordance with the AC electrical signal from the modulation circuit 504. The reader/writer receives the load applied to the antenna coil 501 by electric waves, thereby consequently reading a signal from the microprocessor 506.

The circuit configurations of the IDF chip and the reader/writer shown in FIG. 18B are only an example, and the present invention is not limited thereto. A method for transmitting a signal is not limited to the electromagnetic induction method described in this embodiment. An electromagnetic coupling method, a microwave method, or other transmitting methods may also be adopted. Further, the IDF chip of the invention may have a function such as a GPS.

Embodiment 9

Figure 30:
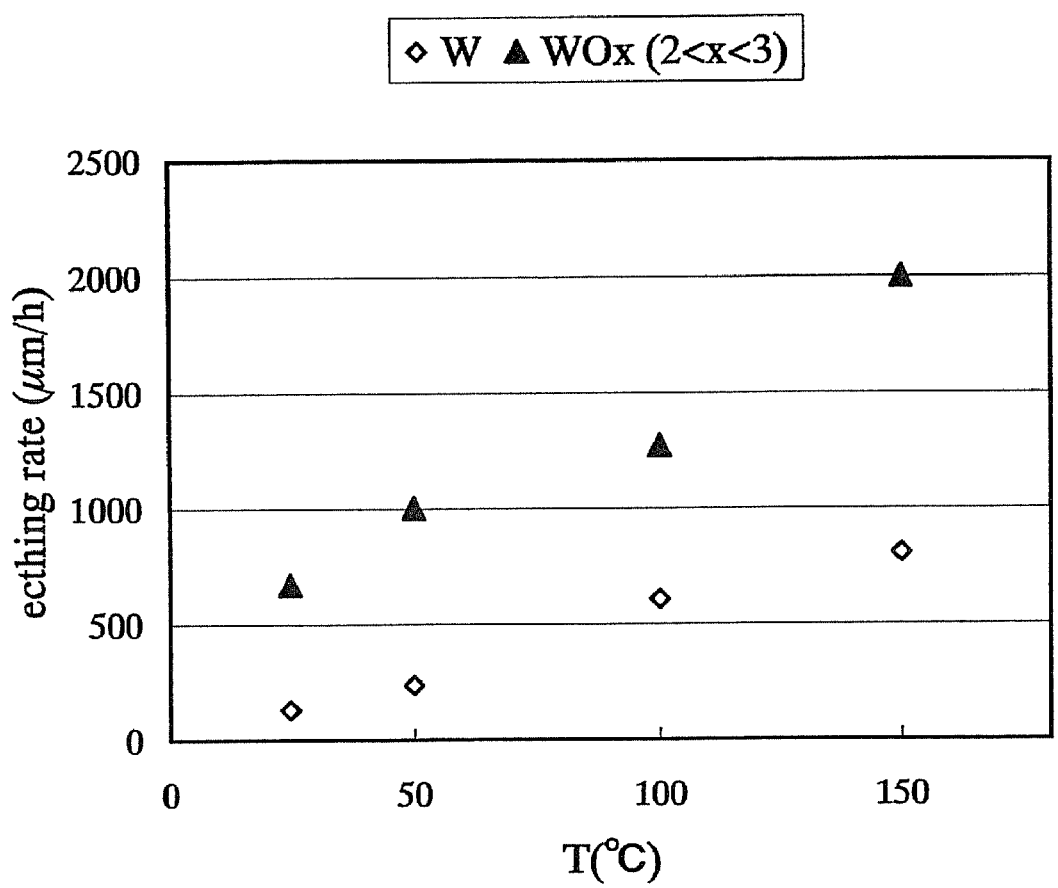
FIG. 30 is a graph showing a comparison of an etching rate between tungsten and tungsten oxide with $ClF_3$.

An experiment for comparing etch rates of tungsten and tungsten oxide with $ClF_3$. FIG. 30 shows etch rates (μm/h) of tungsten and tungsten oxide with $ClF_3$ at temperatures of 25° C., 50° C., 100° C., and 150° C.

As FIG. 30 shows, the etch rate of tungsten oxide is higher than that of tungsten. In other words, it is preferable to use tungsten oxide for a separation layer of the invention, since an IDF chip can be manufactured in a short time due to its high etch rate.

The present application is based on Japanese Priority Application No. 2004-192250 filed on Jun. 29, 2004 with the Japan Patent Office, the entire contents of which are hereby incorporated by reference.

What is claimed is:

1. A method for manufacturing a thin film integrated circuit, comprising the steps of:
    forming a metal film comprising a metal over an insulating substrate;
    forming a metal compound layer comprising a compound of the metal, said compound selected from the group consisting of an oxide, a nitride and a nitride oxide;
    forming a plurality of thin film integrated circuits over said metal compound layer;
    forming a groove between the plurality of thin film integrated circuits to expose a portion of said metal compound layer;
    attaching a substrate having at least one opening to the plurality of thin film integrated circuits; and
    separating the insulating substrate by introducing an etching material comprising a halogen fluoride into said opening so that said metal film and said metal compound layer are removed with the plurality of thin film integrated circuits fixed to each other by the substrate.

2. A method for manufacturing a thin film integrated circuit, according to claim 1, wherein the thin film integrated circuit includes a thin film transistor and nitrogen containing insulating films provided above and below the thin film transistor.

3. A method for manufacturing a thin film integrated circuit, according to claim 1, wherein $ClF_3$ is used as the halogen fluoride.

4. A method for manufacturing a thin film integrated circuit, according to claim 1, wherein the insulating substrate is any one selected from the group consisting of: a glass substrate, a quartz substrate, and a substrate made of a synthetic resin such as plastic or acrylic.

5. A method for manufacturing a thin film integrated circuit, according to claim 1, wherein a mounting position of the thin film integrated circuit X satisfies $(1/2) \cdot D - 30 \, \mu m < X < (1/2) \cdot D + 30 \, \mu m$ when the thickness of a mount article is denoted by D.

6. A method for manufacturing a thin film integrated circuit, according to claim 1, wherein the substrate has an antenna.

7. A method for manufacturing a thin film integrated circuit, according to claim 6, wherein the antenna is attached to the thin film integrated circuit with the use of any one selected from the group consisting of: an anisotropic conductor, an ultrasonic adhesive, and an ultraviolet curing resin.

8. A method for manufacturing a thin film integrated circuit, according to claim 6, wherein the antenna is formed by any method selected from the group consisting of: a droplet discharge method, a sputtering method, a printing method, a plating method, a photolithography method, an evaporation method using a metal mask, and a combination thereof.

9. A method for manufacturing a thin film integrated circuit, according to claim 1, wherein the thin film integrated circuit has a thickness of 0.3 μm to 3 μm.

10. A method for manufacturing a thin film integrated circuit, according to claim 1, wherein the thin film integrated circuit has an area of 25 $mm^2$ or less.

11. A method for manufacturing a thin film integrated circuit, according to claim 1, wherein the thin film integrated circuit includes a semiconductor film having a hydrogen concentration of $1\times10^{19}/cm^3$ to $5\times10^{20}/cm^3$.

12. A method for manufacturing a thin film integrated circuit, according to claim 11, wherein the semiconductor film has a thickness of 0.2 µm or less.

13. A method for manufacturing a thin film integrated circuit, according to claim 12, wherein the semiconductor film includes a source, a drain, and a channel formation region and the source, the drain, and the channel formation region are formed to be perpendicular to a bending direction of a mount article.

14. A method for manufacturing a thin film integrated circuit, according to claim 11, wherein the semiconductor film includes a source, a drain, and a channel formation region and the source, the drain, and the channel formation region are formed to be perpendicular to a bending direction of a mount article.

15. A method for manufacturing a thin film integrated circuit, according to claim 1, wherein each thin film integrated circuit is formed by cutting the plurality of thin film integrated circuits with a method selected from the group consisting of: dicing, scribing, and laser cutting methods.

16. A method for manufacturing a thin film integrated circuit, according to claim 1, wherein the metal is an element selected from W, Ti, Ta, Mo, Nd, Ni, Co, Zr, Zn, Ru, Rh, Pd, Os, and Ir or an alloy material or a compound material containing the element.

17. A method for manufacturing a thin film integrated circuit, according to claim 1, wherein the etching material comprising the halogen fluoride is a gas or liquid.

18. A method for manufacturing a thin film integrated circuit, comprising the steps of:
  forming a metal film comprising a metal over an insulating substrate;
  forming a metal compound layer comprising a compound of the metal, said compound selected from the group consisting of an oxide, a nitride and a nitride oxide;
  forming a plurality of thin film integrated circuits over said metal compound layer;
  forming a groove between the plurality of thin film integrated circuits to expose a portion of said metal compound layer;
  attaching a substrate having at least one opening to the plurality of thin film integrated circuits;
  separating the insulating substrate by introducing an etching material comprising a halogen fluoride into said opening so that said metal film and said metal compound layer are removed with the plurality of thin film integrated circuits fixed to each other by the substrate; and
  attaching the plurality of thin film integrated circuits which are connected to a flexible substrate.

19. A method for manufacturing a thin film integrated circuit, according to claim 18, wherein the thin film integrated circuit includes a thin film transistor and nitrogen containing insulating films provided above and below the thin film transistor.

20. A method for manufacturing a thin film integrated circuit, according to claim 18, wherein $ClF_3$ is used as the halogen fluoride.

21. A method for manufacturing a thin film integrated circuit, according to claim 18, wherein the insulating substrate is any one selected from the group consisting of: a glass substrate, a quartz substrate, and a substrate made of a synthetic resin such as plastic or acrylic.

22. A method for manufacturing a thin film integrated circuit, according to claim 18, wherein a mounting position of the thin film integrated circuit X satisfies $(½)\cdot D-30$ µm$<X<(½)\cdot D+30$ µm when the thickness of a mount article is denoted by D.

23. A method for manufacturing a thin film integrated circuit, according to claim 18, wherein the substrate has an antenna.

24. A method for manufacturing a thin film integrated circuit, according to claim 23, wherein the antenna is attached to the thin film integrated circuit with the use of any one selected from the group consisting of: an anisotropic conductor, an ultrasonic adhesive, and an ultraviolet curing resin.

25. A method for manufacturing a thin film integrated circuit, according to claim 23, wherein the antenna is formed by any method selected from the group consisting of: a droplet discharge method, a sputtering method, a printing method, a plating method, a photolithography method, an evaporation method using a metal mask, and a combination thereof.

26. A method for manufacturing a thin film integrated circuit, according to claim 18, wherein the thin film integrated circuit has a thickness of 0.3 µm to 3 µm.

27. A method for manufacturing a thin film integrated circuit, according to claim 18, wherein the thin film integrated circuit has an area of 25 mm$^2$ or less.

28. A method for manufacturing a thin film integrated circuit, according to claim 18, wherein the thin film integrated circuit includes a semiconductor film having a hydrogen concentration of $1\times10^{19}/cm^3$ to $5\times10^{20}/cm^3$.

29. A method for manufacturing a thin film integrated circuit, according to claim 28, wherein the semiconductor film has a thickness of 0.2 µm or less.

30. A method for manufacturing a thin film integrated circuit, according to claim 29, wherein the semiconductor film includes a source, a drain, and a channel formation region and the source, the drain, and the channel formation region are formed to be perpendicular to a bending direction of a mount article.

31. A method for manufacturing a thin film integrated circuit, according to claim 28, wherein the semiconductor film includes a source, a drain, and a channel formation region and the source, the drain, and the channel formation region are formed to be perpendicular to a bending direction of a mount article.

32. A method for manufacturing a thin film integrated circuit, according to claim 18, wherein each thin film integrated circuit is formed by cutting the plurality of thin film integrated circuits with a method selected from the group consisting of: dicing, scribing, and laser cutting methods.

33. A method for manufacturing a thin film integrated circuit, according to claim 18, wherein the metal is an element selected from W, Ti, Ta, Mo, Nd, Ni, Co, Zr, Zn, Ru, Rh, Pd, Os, and Ir or an alloy material or a compound material containing the element.

34. A method for manufacturing a thin film integrated circuit, according to claim 18, wherein the etching material comprising the halogen fluoride is a gas or liquid.

35. A method for manufacturing a thin film integrated circuit, comprising the steps of:
  forming a metal film comprising a metal over an insulating substrate;
  forming a metal compound layer comprising a compound of the metal, said compound selected from the group consisting of an oxide, a nitride and a nitride oxide;
  forming a plurality of thin film integrated circuits over said metal compound layer;

selectively forming a groove between the plurality of thin film integrated circuits to expose a portion of said metal compound layer and form a connection region which is a part of the plurality of the thin film integrated circuits;

attaching a substrate having at least one opening to the plurality of thin film integrated circuits; and separating the insulating substrate by introducing an etching material comprising a halogen fluoride into said groove and said opening so that said metal film and said metal compound layer are removed with the plurality of thin film integrated circuits fixed to each other by the substrate.

36. A method for manufacturing a thin film integrated circuit, according to claim 35, wherein the thin film integrated circuit includes a thin film transistor and nitrogen containing insulating films provided above and below the thin film transistor.

37. A method for manufacturing a thin film integrated circuit, according to claim 35, wherein $ClF_3$ is used as the halogen fluoride.

38. A method for manufacturing a thin film integrated circuit, according to claim 35, wherein the insulating substrate is any one selected from the group consisting of: a glass substrate, a quartz substrate, and a substrate made of a synthetic resin such as plastic or acrylic.

39. A method for manufacturing a thin film integrated circuit, according to claim 35, wherein a mounting position of the thin film integrated circuit X satisfies $(½)·D−30$ μm$<X<(½)·D+30$ μm when the thickness of a mount article is denoted by D.

40. A method for manufacturing a thin film integrated circuit, according to claim 35, wherein the substrate has an antenna.

41. A method for manufacturing a thin film integrated circuit, according to claim 40, wherein the antenna is attached to the thin film integrated circuit with the use of any one selected from the group consisting of: an anisotropic conductor, an ultrasonic adhesive, and an ultraviolet curing resin.

42. A method for manufacturing a thin film integrated circuit, according to claim 35, wherein the thin film integrated circuit has a thickness of 0.3 μm to 3 μm.

43. A method for manufacturing a thin film integrated circuit, according to claim 35, wherein the thin film integrated circuit has an area of 25 mm$^2$ or less.

44. A method for manufacturing a thin film integrated circuit, according to claim 35, wherein the thin film integrated circuit includes a semiconductor film having a hydrogen concentration of $1×10^{19}/cm^3$ to $5×10^{20}/cm^3$.

45. A method for manufacturing a thin film integrated circuit, according to claim 44, wherein the semiconductor film has a thickness of 0.2 μm or less.

46. A method for manufacturing a thin film integrated circuit, according to claim 45, wherein the semiconductor film includes a source, a drain, and a channel formation region and the source, the drain, and the channel formation region are formed to be perpendicular to a bending direction of a mount article.

47. A method for manufacturing a thin film integrated circuit, according to claim 44, wherein the semiconductor film includes a source, a drain, and a channel formation region and the source, the drain, and the channel formation region are formed to be perpendicular to a bending direction of a mount article.

48. A method for manufacturing a thin film integrated circuit, according to claim 35, wherein each thin film integrated circuit is formed by cutting the plurality of thin film integrated circuits with a method selected from the group consisting of: dicing, scribing, and laser cutting methods.

49. A method for manufacturing a thin film integrated circuit, according to claim 35, wherein the metal is an element selected from W, Ti, Ta, Mo, Nd, Ni, Co, Zr, Zn, Ru, Rh, Pd, Os, and Ir or an alloy material or a compound material containing the element.

50. A method for manufacturing a thin film integrated circuit, according to claim 35, wherein the etching material comprising the halogen fluoride is a gas or liquid.

* * * * *